(12) United States Patent
Eveson et al.

(10) Patent No.: US 11,302,838 B2
(45) Date of Patent: Apr. 12, 2022

(54) PHOTOVOLTAIC CELLS

(71) Applicant: DUPONT TEIJIN FILMS U.S. LIMITED PARTNERSHIP, Wilmington, DE (US)

(72) Inventors: Robert Eveson, Cleveland (GB); Michael Heeran, Cleveland (GB); Robert Hutchings, Cleveland (GB); Simon Mortlock, Dumfries (GB)

(73) Assignee: DuPont Teijin Films U.S. Limited Partnership, Wilmington, DE (US)

( * ) Notice: Subject to any disclaimer, the term of this patent is extended or adjusted under 35 U.S.C. 154(b) by 103 days.

(21) Appl. No.: 15/559,841

(22) PCT Filed: Mar. 18, 2016

(86) PCT No.: PCT/GB2016/050752
§ 371 (c)(1),
(2) Date: Sep. 20, 2017

(87) PCT Pub. No.: WO2016/151292
PCT Pub. Date: Sep. 29, 2016

(65) Prior Publication Data
US 2018/0053866 A1     Feb. 22, 2018

(30) Foreign Application Priority Data

Mar. 20, 2015  (GB) ..................... 1504760

(51) Int. Cl.
*H01L 31/049*   (2014.01)
*B32B 27/26*    (2006.01)
(Continued)

(52) U.S. Cl.
CPC .............. *H01L 31/049* (2014.12); *B32B 7/12* (2013.01); *B32B 27/08* (2013.01); *B32B 27/18* (2013.01);
(Continued)

(58) Field of Classification Search
CPC ..... H01L 31/049; H01L 31/0481; B32B 7/12; B32B 27/08; B32B 27/18; B32B 27/26;
(Continued)

(56) References Cited

U.S. PATENT DOCUMENTS 3,244,708 A   4/1966  Duennenberger et al.
3,843,371 A   10/1974 Piller et al.
(Continued)

FOREIGN PATENT DOCUMENTS

CN   1802255 A    7/2006
CN   102195075 A  9/2011
(Continued)

OTHER PUBLICATIONS

English translation of JP2014214253.*
(Continued)

*Primary Examiner* — Devina Pillay
(74) *Attorney, Agent, or Firm* — Wolf, Greenfield & Sacks, P.C.

(57) ABSTRACT

The invention is concerned with photovoltaic cells, processes for the production thereof and polyester films useful in the production thereof wherein the back plane of the photovoltaic cell is a polyester film having an adhesive coating derived from a composition comprising an epoxy resin and a blocked diisocyanate.

30 Claims, 4 Drawing Sheets

(51) Int. Cl.
*B32B 7/12* (2006.01)
*B32B 27/08* (2006.01)
*B32B 27/18* (2006.01)
*B32B 27/36* (2006.01)
*B32B 37/24* (2006.01)
*C09J 7/35* (2018.01)
*C09J 7/22* (2018.01)

(52) U.S. Cl.
CPC ........... *B32B 27/26* (2013.01); *B32B 27/36* (2013.01); *B32B 37/24* (2013.01); *C09J 7/22* (2018.01); *C09J 7/35* (2018.01); *B32B 2037/243* (2013.01); *B32B 2255/10* (2013.01); *B32B 2255/26* (2013.01); *B32B 2264/102* (2013.01); *B32B 2264/105* (2013.01); *B32B 2264/108* (2013.01); *B32B 2307/40* (2013.01); *B32B 2307/4026* (2013.01); *B32B 2307/41* (2013.01); *B32B 2307/412* (2013.01); *B32B 2307/50* (2013.01); *B32B 2307/516* (2013.01); *B32B 2307/518* (2013.01); *B32B 2307/546* (2013.01); *B32B 2307/558* (2013.01); *B32B 2307/71* (2013.01); *B32B 2307/712* (2013.01); *B32B 2307/718* (2013.01); *B32B 2307/7242* (2013.01); *B32B 2307/732* (2013.01); *B32B 2307/734* (2013.01); *B32B 2367/00* (2013.01); *B32B 2405/00* (2013.01); *B32B 2457/00* (2013.01); *B32B 2457/12* (2013.01); *B32B 2457/20* (2013.01); *B32B 2457/206* (2013.01); *C09J 2203/322* (2013.01); *C09J 2463/00* (2013.01); *C09J 2467/006* (2013.01); *Y02E 10/50* (2013.01)

(58) Field of Classification Search
CPC ... B32B 27/36; B32B 37/24; B32B 2037/243; B32B 2307/40; B32B 2307/4026; B32B 2307/41; B32B 2307/412; B32B 2307/50; B32B 2307/516; B32B 2307/518; B32B 2307/546; B32B 2307/558; B32B 2307/71; B32B 2307/712; B32B 2307/718; B32B 2307/7242; B32B 2307/732; B32B 2307/734; B32B 2255/10; B32B 2255/26; B32B 2264/102; B32B 2264/105; B32B 2264/108; B32B 2367/00; B32B 2405/00; B32B 37/12; B32B 38/164; B32B 2457/00; B32B 2457/12; B32B 2457/20; B32B 2457/206; C09J 7/22; C09J 7/35; C09J 163/00; C09J 2203/322; C09J 2463/00; C09J 2467/006; Y02E 10/50
See application file for complete search history.

(56) References Cited

U.S. PATENT DOCUMENTS

| | | |
|---|---|---|
| 4,446,262 A | 5/1984 | Okumura et al. |
| 4,619,956 A | 10/1986 | Susi |
| 4,681,905 A | 7/1987 | Kubota et al. |
| 4,684,679 A | 8/1987 | Kubota et al. |
| 4,812,498 A | 3/1989 | Nakahara et al. |
| 5,251,064 A | 10/1993 | Tennant et al. |
| 5,264,539 A | 11/1993 | Shepard |
| 5,288,778 A | 2/1994 | Schmitter et al. |
| 6,106,950 A | 8/2000 | Searle et al. |
| 9,716,275 B2 | 7/2017 | Kobayashi et al. |
| 2003/0180560 A1* | 9/2003 | Peiffer ............... B32B 27/36 428/480 |
| 2006/0263592 A1* | 11/2006 | Kusume ............. G02B 5/0841 428/327 |
| 2007/0221268 A1* | 9/2007 | Hasch ................ H01L 51/448 136/251 |
| 2010/0028586 A1 | 2/2010 | Enlow et al. |
| 2010/0112323 A1* | 5/2010 | Mori .................. B32B 27/34 428/220 |
| 2012/0021197 A1* | 1/2012 | Matsumura ......... B32B 27/36 428/213 |
| 2012/0189832 A1* | 7/2012 | Kawasaki ........... G02B 1/105 428/216 |
| 2013/0323502 A1 | 12/2013 | Hashimoto |
| 2015/0062503 A1* | 3/2015 | Yoon .................. C09J 153/005 349/96 |

FOREIGN PATENT DOCUMENTS

| | | | |
|---|---|---|---|
| CN | 102229701 | * 11/2011 | ............ C08G 59/20 |
| EP | 0006686 A2 | 1/1980 | |
| EP | 0031202 A2 | 7/1981 | |
| EP | 0031203 A2 | 7/1981 | |
| EP | 0076582 A1 | 4/1983 | |
| EP | 0718347 A1 | 6/1996 | |
| EP | 2479801 A1 | 7/2012 | |
| EP | 2774964 A1 | 9/2014 | |
| EP | 2775535 A1 | 9/2014 | |
| EP | 2811534 A1 | 12/2014 | |
| JP | 2006035540 | * 2/2006 | |
| JP | 2006332091 A | 12/2006 | |
| JP | 2007268710 A | 10/2007 | |
| JP | 2012124357 A | 6/2012 | |
| JP | 2013010238 A | 1/2013 | |
| JP | 2014214253 A | 11/2014 | |
| JP | 2014218012 A | 11/2014 | |
| WO | 9405645 A1 | 3/1994 | |
| WO | 2013000648 A1 | 1/2013 | |
| WO | 2013171124 A1 | 11/2013 | |
| WO | WO-2014209928 A1 | * 12/2014 | |

OTHER PUBLICATIONS

International Search Report and Written Opinion for International Application No. PCT/GB2016/050752, dated Jun. 20, 2016—9 Pages.
Great Britain Search Report for GB Application No. 1504760.8, dated Sep. 7, 2015, 3 pages.
Chinese Office Action with Search Report for Chinese Application No. 201680028929.2, dated Nov. 18, 2020, 9 pages.

* cited by examiner

PHOTOVOLTAIC CELLS

This application is a National Phase filing of International Application No. PCT/GB2016/050752, filed 18 Mar. 2016, and claims priority benefit of GB Application No. 1504760.8, filed 20 Mar. 2015, the entirety of which applications is incorporated herein by reference for all purposes.

FIELD OF THE INVENTION

The present invention relates to photovoltaic (PV) cells, processes for the production thereof and polyester films useful in the production thereof. The polyester films are particularly suitable for use as back-planes in PV cells.

BACKGROUND OF THE INVENTION

The advantageous mechanical properties, dimensional stability and optical properties of polyester films are well-known and are exploited in many areas of technology. Many adaptations of polyester films have been proposed in order to tailor the properties of a polyester film to a particular application. However, an adaptation which improves the performance of a polyester film in one respect may be detrimental to the performance of the film in another respect. For instance, a modification to improve the optical properties of a film may have a detrimental effect on the mechanical properties of the film. Accordingly, it is often difficult to obtain polyester films having a suitable combination of desirable properties.

In order to improve the performance of polyester films, it is known to provide multi-layer films having complementary properties so as to form a composite structure. In some cases, multi-layer films may comprise two or more films of the same type in order to improve the mechanical strength of the film or to intensify other functional properties of the film. Alternatively, multi-layer films may comprise two or more films of different types, thereby enabling the properties of the different polyester films to be realised simultaneously. For example, multi-layer polyester films have been used to improve the handling properties of functional polyester films by disposing one or more films having desirable functional properties onto a base film having desirable mechanical properties. Laminated polyester films may suitably be prepared by co-extrusion, coating or lamination techniques.

The mechanical properties, dimensional stability, flexibility, weight, impact resistance and optical properties of polyester films offer advantages for their use in the manufacture of electronic or opto-electronic devices, such as electroluminescent (EL) display devices (particularly organic light emitting display (OLED) devices), electrophoretic displays (e-paper), photovoltaic (PV) cells and semiconductor devices (such as organic field effect transistors, thin film transistors and integrated circuits generally). The use of flexible polyester film as layer(s) in electronic devices allows the manufacture of such devices in a reel-to-reel process, thereby reducing cost.

A photovoltaic cell generally comprises a front-plane (or front-sheet); a front-side encapsulant material; the photoactive material on an electrode support substrate; a rear-side encapsulant; a rear back-plane (or back-sheet); and various components to collect and manage the electrical charge. Polyester films have been proposed in the manufacture of various layers in PV cells, for instance the front-plane, the back-plane, the electrode support layer(s). Photovoltaic modules, often consisting of many photovoltaic cells, are usually categorized according to the active photovoltaic materials used. These include crystalline silicon, gallium-arsenide (GaAs), amorphous silicon (a-Si), cadmium-telluride (CdTe), copper-indium-gallium-(di)selenide (CIGS), dye-sensitized or organic cells. Photovoltaic cells containing gallium-arsenide, amorphous silicon, cadmium-telluride, copper-indium-gallium-(di)selenide, dye-sensitized or conductive organic material are often referred to as thin-film photovoltaic cells (TFPV cells), which may or may not be flexible. Dye-sensitised PV cells are of particular interest, in which the active light-absorbing layer comprises a dye which is excited by absorbing incident light. Other thin-film silicon PV cells include protocrystalline, nanocrystalline (nc-Si or nc-Si:H) and black silicon PV cells. Thin-film photovoltaic cells are made by depositing one or more thin layers of photovoltaic material on a substrate, the thickness range of a thin layer varying from 1 or 2 nanometers to tens of micrometer, using a variety of deposition methods and a variety of substrates.

The back-plane, in particular, must exhibit good thermal dimensional stability. This has typically been a significant problem for polymeric materials, which tend to exhibit poorer dimensional stability than optical-quality glass or quartz. In PV cells generally, poor dimensional stability of a polymeric layer can result in the cracking of the adjacent encapsulant material, and particularly during the elevated temperatures (typically 130 to 160° C.; typically for up to 30 minutes) and normally also low pressure experienced during manufacture of the device. For instance, prior art films have been observed to exhibit wrinkling and movement during the manufacture of a PV device.

The back-plane should also exhibit good UV-stability. Lack of UV-stability can manifest itself in a yellowing, hazing and cracking of the film on exposure to sunlight thereby decreasing the effective service lifetime of the PV cell.

The encapsulant material is a barrier material which protects the photoactive and electrode layers and provides high resistance to gas and solvent permeation. The encapsulating barrier material is typically utilised in the form of a self-supporting film or sheet, which is applied to the composite comprising photoactive and electrode layers using lamination techniques, typically under vacuum, as is known in the art. The encapsulated composite is then sandwiched between a front-plane and a back-plane.

A problem with prior art devices has been the need for one or more additional primer layer(s) or surface treatment(s) to improve adhesion between the back-plane and the encapsulant. In particular, it has been necessary to coat the back-plane with a first adhesive inter-layer and then a second adhesive layer, wherein the second adhesive layer is a material having high adhesion to the encapsulant of the PV cell or is the same material as the encapsulant. It would be desirable to dispense with both of these additional adhesive layers and the additional process steps required to apply them, in order to increase manufacturing efficiency and reduce costs. In addition, it would be desirable to improve the adhesion between the back-plane and the encapsulant, relative to the prior art devices.

SUMMARY OF THE INVENTION

Therefore, it is an object of the present invention to dispense with the additional adhesive and primer layers used in existing manufacturing processes to incorporate polyester films as back-planes into PV cells by providing a polyester film suitable as a back-plane in PV cells which exhibits improved adhesion directly to encapsulant materials.

The present invention provides a photovoltaic cell comprising a transparent front plane, an opaque back plane and an encapsulant resin, wherein the back plane is a polyester film comprising a polyester film substrate (B) and an adhesive coating (A), wherein the adhesive coating is derived from a composition comprising an epoxy resin and a blocked diisocyanate and wherein the encapsulant resin and polyester film are disposed in the photovoltaic cell such that the layer (A) is in contact with the encapsulant resin.

Advantageously, in the PV cell according to the present invention, the polyester film which forms the back-plane is adhered directly to the encapsulant resin without the need for an additional adhesive or primer layer. This is desirable because it reduces the number of manufacturing steps required in the production of the PV cell.

Therefore, in a further aspect, the present invention provides a method for producing a photovoltaic cell comprising a transparent front plane and an encapsulant resin comprising laminating a polyester film comprising a polyester film substrate (B) and an adhesive coating (A) directly to the encapsulant resin, wherein the polyester film forms an opaque back plane in the photovoltaic cell and the adhesive coating is derived from a composition comprising an epoxy resin and a blocked diisocyanate.

By providing a polyester film which has been coated with a carefully selected adhesive composition, it is possible, advantageously, to adhere the polyester film directly to an encapsulant resin without the need for additional adhesive or primer layers. In this regard, in a further aspect, the present invention provides a polyester film comprising a polyester film substrate (B) and an adhesive coating (A) wherein the adhesive is derived from a composition comprising an epoxy resin and a blocked diisocyanate.

Figure 1:
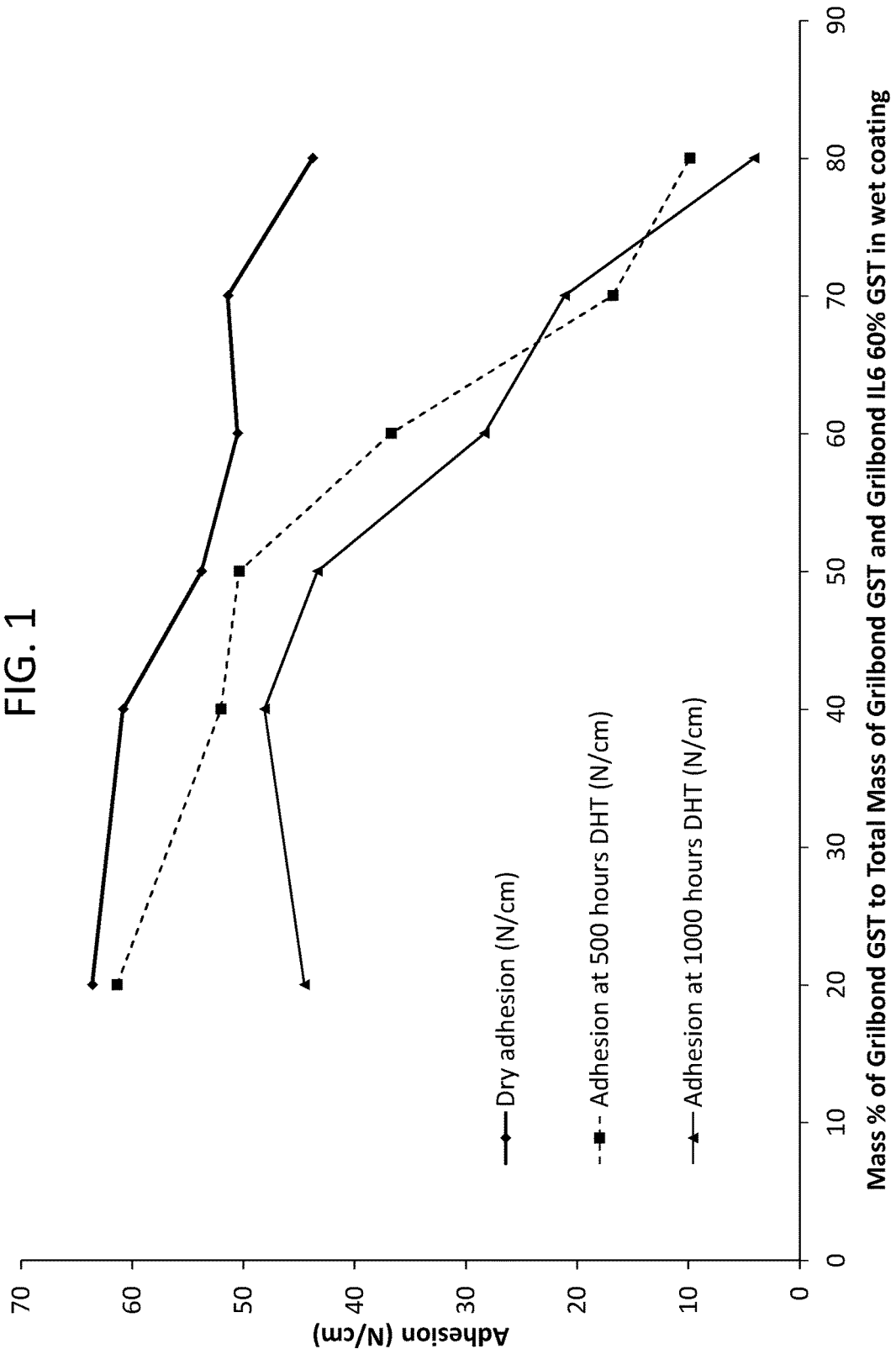
FIG. 1 shows the effect that the ratio of epoxy resin to caprolactam-blocked MDI diisocyanate curing agent present in the adhesive composition from which the adhesive coating (A) of the polyester film is derived has on the adhesive strength and the resistance to damp ageing.

Accordingly, the present inventors have unexpectedly found that by providing a base polyester film with a carefully selected adhesive coating, it is possible to adhere the polyester film, which is to form the back-plane in a photovoltaic cell, directly to an encapsulant resin without the need for additional adhesive and/or primer layers. They have found that, surprisingly, the bond which is formed between the adhesive coating on the polyester film is sufficiently strong that excellent adhesion to both the polyester film and the encapsulant resin is retained even following prolonged exposure to moisture over an extended period of time, in particular under humid conditions and/or elevated temperatures. This is particularly advantageous in the field of PV cells which, in use, are liable to be subjected to such conditions. The fact that additional adhesives and/or primers are no longer required means that the manufacturing processes are simplified and can be economically optimised.

The polyester film substrate (B) is a self-supporting film or sheet by which is meant a film or sheet capable of independent existence in the absence of a supporting base. Preferably, the polyester film is a biaxially oriented polyester film.

The term polyester as used herein refers to a polyester or copolyester derived from one or more diols, one or more aromatic dicarboxylic acids and optionally one or more aliphatic dicarboxylic acids having the general formula $C_nH_{2n}(CO_2H)_2$, wherein n is from 0 to 8.

The polyester film substrate is preferably a polyethylene terephthalate (PET) film or a polyethylene-2,6-naphthalate (PEN) film, more preferably a polyethylene terephthalate film. The PET or PEN polyester may optionally comprise, as one or more comonomer(s), relatively minor amounts, preferably less than 20% by weight, less than 10% by weight or less than 5% by weight, of one or more residues derived from other dicarboxylic acids and/or diols. Other dicarboxylic acids include isophthalic acid, phthalic acid, 1,4-, 2,5-, or 2,7-naphthalenedicarboxylic acid, 4,4'-diphenyldicarboxylic acid, hexahydroterephthalic acid, 1,10-decanedicarboxylic acid and aliphatic dicarboxylic acids of the general formula $C_nH_{2n}(COOH)_2$ wherein n is 2 to 8, such as succinic acid, glutaric acid sebacic acid, adipic acid, azelaic acid, suberic acid or pimelic acid. Other diols include aliphatic and cycloaliphatic glycols, such as diethylene glycol, propylene glycol, dipropylene glycol, 1,3-propanediol, 1,4-butane diol and 1,4-cyclohexanedimethanol. Preferably the polyester contains only one dicarboxylic acid, i.e. terephthalic acid or 2,6-naphthalene dicarboxylic acid, preferably terephthalic acid. Preferably the polyester contains only one diol, i.e. ethylene glycol.

The intrinsic viscosity of the polyester is preferably at least about 0.60, preferably at least about 0.65, preferably at least about 0.70, preferably at least about 0.75, and preferably at least about 0.80. Preferably, the intrinsic viscosity of the polyester is not more than 0.85, preferably not more than 0.83. The use of polyesters with a relatively high intrinsic viscosity provides improved hydrolysis stability, although too high a viscosity can lead to difficulties in film manufacture and/or require specialised, more robust film-forming equipment. For instance, increasing the viscosity too greatly may mean that it is appropriate to reduce output (i.e. reduce the amount of PET extruded per unit time, which leads to a less economical process) or to increase the extrusion temperature in order to reduce the viscosity of the melt (which in turn can lead to thermal degradation of the polymer and the loss of associated properties) in order to achieve stable film production.

Formation of the polyester is conveniently effected in a known manner by condensation or ester interchange, generally at temperatures up to about 295° C. In a preferred embodiment, solid state polymerisation may be used to increase the intrinsic viscosity to the desired value, using conventional techniques well-known in the art, for instance using a fluidised bed such as a nitrogen fluidised bed or a vacuum fluidised bed using a rotary vacuum drier.

The polyester is the major component of the polyester film substrate, and makes up at least 50%, preferably at least 60%, more preferably at least 70%, and preferably at least 80% by weight of the total weight of the polyester film substrate. For example, the polyester may make up at least 85%, at least 90% or at least 95% by weight of the total weight of the polyester film substrate.

The polyester layer film substrate may further comprise any other additive conventionally employed in the manufacture of polyester films. Thus, additives such as UV absorbers, antioxidants, hydrolysis stabilisers, fillers, cross-linking agents, dyes, pigments, voiding agents, lubricants, radical scavengers, thermal stabilisers, flame retardants and inhibitors, anti-blocking agents, surface active agents, slip aids, gloss improvers, prodegradents, viscosity modifiers and dispersion stabilisers may be incorporated as appropriate. Such components may be introduced into the polymer in a conventional manner. For example, by mixing with the monomeric reactants from which the polyester is derived, or the components may be mixed with the polymer by tumble or dry blending or by compounding in an extruder, followed by cooling and, usually, comminution into granules or chips.

The polyester film substrate (B) preferably comprises a particulate filler material. Particulate fillers are useful to improve handling and windability properties of polyesters films during manufacture. In the context of the present invention, the particulate filler is used in the polyester film substrate (B) primarily to modulate its optical properties. The particulate filler is preferably a particulate inorganic filler, for example metal or metalloid oxides, such as alumina, titania, talc and silica (especially precipitated or diatomaceous silica and silica gels), calcined china clay and alkaline metal salts (such as the carbonates and sulphates of calcium and barium). The inorganic filler present should be finely-divided, and the volume distributed median particle diameter (equivalent spherical diameter corresponding to 50% of the volume of all the particles, read on the cumulative distribution curve relating volume % to the diameter of the particles—often referred to as the "D(v,0.5)" value) thereof is preferably in the range from 0.01 to 5 µm, more preferably 0.05 to 1.5 µm, and particularly 0.15 to 1.2 µm. Preferably at least 90%, more preferably at least 95% by volume of the inorganic filler particles are within the range of the volume distributed median particle diameter ±0.8 µm, and particularly ±0.5 µm. Particle size of the filler particles may be measured by electron microscope, coulter counter, sedimentation analysis and static or dynamic light scattering. Techniques based on laser light diffraction are preferred. The median particle size may be determined by plotting a cumulative distribution curve representing the percentage of particle volume below chosen particle sizes and measuring the 50th percentile.

The amount of particulate filler present in the polyester film substrate (B) is preferably in the range of from about 0.1 to about 30% by weight, preferably in the range of from about 0.3 to about 30% by weight, preferably in the range of from about 2.0 to about 25% by weight, based on the weight of polyester in the layer, preferably at least about 3% by weight, and preferably no more than about 20% by weight. The amount of particulate filler depends, inter alia, on the identity of filler. Thus, where the particulate filler is selected from $BaSO_4$, the filler is preferably present in an amount of from 10% to about 20%, preferably from about 15% to about 20% by weight, based on the weight of polyester in the layer. Where the particulate filler is selected from $TiO_2$, the filler is preferably present in an amount of from 0.3% to about 15%, preferably from about 0.5% to about 10% by weight, preferably from about 1% to about 8%, preferably from about 3% to about 7%, based on the weight of polyester in the layer.

Preferably, the particulate filler is used as an opacifying agent to increase the opacity of the polyester film substrate (B), such that the polyester film substrate (B) is opaque and preferably exhibits a Transmission Optical Density (TOD) of at least 0.3, preferably at least 0.4, preferably at least 0.5, preferably at least 0.6, preferably at least 0.7, preferably at least 1.0 and preferably at least 1.5, and in one embodiment preferably at least 2.0, preferably at least 3.0, and preferably at least 4.0. In some embodiments, the particulate filler is selected such that the polyester film substrate (B) is white, grey or black.

Preferably, the particulate filler is selected such that the polyester film substrate (B) is an opaque white layer. Films according to this embodiment of the invention preferably exhibit a TOD in the range of at least about 0.3, preferably at least about 0.4, preferably 0.5, preferably at least 0.6, preferably 0.7, and typically no more than about 1.75. Preferred particulate fillers having a whitening effect include particulate inorganic fillers, preferably titanium dioxide and/or barium sulphate, and preferably either titanium dioxide or barium sulphate, and these are preferably present in the amounts described hereinabove. A white film preferably exhibits a whiteness index, measured as herein described, in the range of from about 60 to about 120 units. In an alternative embodiment, the particulate filler is selected such that the polyester film substrate (B) is an opaque grey or black layer. Films according to this embodiment of the invention typically exhibit a TOD of at least 2.0, more typically at least 3.0, more typically at least 4.0. Preferred particulate fillers having a darkening effect layer include carbon black and metallic fillers, such as aluminium powder. Carbon black is a preferred opacifying agent. In the case of a black or grey base layer (B), the amount of filler present in the polyester film substrate (B) is typically in the range of from about 0.3% to about 10% by weight, preferably 0.5% to 7% by weight, particularly 1% to 5% by weight, and especially 2% to 4% by weight, based on the weight of the polyester in the layer. The opacifying agent suitably has a mean particle diameter in the range from 0.01 to 1.5 µm, particularly 0.02 to 0.05 µm.

In a further embodiment, polyester film substrate (B) may comprise a combination of particulate fillers having and whitening effect with particulate fillers having a darkening effect. Suitable fillers are as described above, and the total amount of fillers in the polyester film substrate (B) is preferably in the range of from 1% to 30% by weight, preferably 2% to 20% by weight, based on the weight of polyester in the layer. Films according to this embodiment of the invention typically exhibit a TOD of at least 1.0, more preferably at least 2.0 and more preferably at least 3.0.

Alternatively or in addition to the inclusion of a particulate filler, preferably the polyester film substrate (B) comprises a hydrolysis stabiliser. The skilled person will be familiar with suitable hydrolysis stabilisers. In one embodiment, the hydrolysis stabiliser may be a glycidyl ester of a branched monocarboxylic acid, wherein the monocarboxylic acid has from 5 to 50 carbon atoms, and wherein said glycidyl ester is present in the form of its reaction product with at least some of the end groups of the polyester from which the polyester film substrate (B) is formed.

Suitable glycidyl esters are those derived from branched monocarboxylic acids having from 5 to 50 carbon atoms, preferably from 5 to 25 carbon atoms, preferably from 5 to 15 carbon atoms, preferably from 8 to 12 carbon atoms, preferably from 9 to 11 carbon atoms, and in one embodiment has 10 carbon atoms. The monocarboxylic acid is preferably saturated, i.e. the carbon-carbon bonds in the molecule are all single bonds. Particularly preferred branched monocarboxylic acids include those in which the carbon atom adjacent the carboxylic acid group (hereinafter referred to as the "α-carbon" atom) is a tertiary carbon atom, i.e. it is attached via three carbon-carbon single bonds to three carbon atoms other than the carbon atom of the carboxylic acid group, and each of said three carbon atoms may be part of an alkylene group or an alkyl group. The monocarboxylic acid is preferably a synthetic material, i.e. it is manufactured via organic synthesis comprising at least one synthetic step according to conventional procedures (see for instance WO-01/56966-A1), rather than a naturally occurring material (such as a fatty acid) which may require isolation from a naturally occurring substance.

The glycidyl esters may easily be manufactured by the known reaction of epichlorohydrin with the desired branched monocarboxylic acid. The reaction may be conducted using conventional acidic or basic catalysts, such as alkali metal carboxylates and quaternary ammonium halides, typically at elevated temperatures (temperatures in the range of 50 to 120° C. are typical).

Preferred glycidyl esters include those having the formula (I):

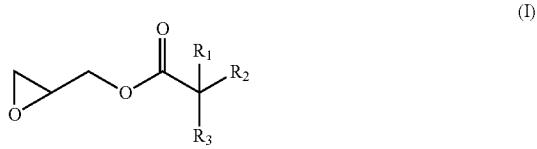

wherein:

$R^1$ and $R^2$ are independently selected from alkyl, $R^3$ is selected from hydrogen and alkyl, and preferably from alkyl; and wherein the total number of carbon atoms in the groups $R^1$, $R^2$ and $R^3$ is from 3 to 48, preferably from 3 to 23, preferably from 3 to 13, preferably from 6 to 10, preferably from 7 to 9, and in one embodiment is 8.

In preferred embodiments, at least one of $R^1$ and $R^2$ is methyl. More preferably, $R^1$ is methyl and $R^2$ is an alkyl group comprising at least 2 carbon atoms.

In preferred embodiments, a mixture of glycidyl esters may be used in the polyester film substrate (B), wherein each of the glycidyl esters is independently selected according to formula (I), and preferably such that the total number of carbon atoms in the alkyl groups $R^1$, $R^2$ and $R^3$ in each glycidyl ester of the mixture is the same.

In preferred embodiments, $R^1$ is methyl, and $R^2$ and $R^3$ are independently selected from alkyl groups such that the total number of carbon atoms in $R^2$ and $R^3$ is from 2 to 47, preferably from 2 to 22, preferably from 2 to 12, preferably from 5 to 9, preferably from 6 to 8, and in one embodiment the total number of carbon atoms in $R^2$ and $R^3$ is 7. In further embodiments, a mixture of these preferred glycidyl esters is used, preferably such that the total number of carbon atoms in the alkyl groups $R^1$, $R^2$ and $R^3$ in each component of the mixture is the same.

As used herein, the term "alkyl" preferably refers to an unsubstituted straight-chain acyclic hydrocarbon group of formula $[-C_nH_{2n+1}]$.

The glycidyl esters described above include chiral compounds. Chiral glycidyl esters may be present as either enantiomer or as a mixture of enantiomers. Generally, any chiral glycidyl esters will be present as a racemic mixture.

The glycidyl ester or mixture of glycidyl esters used in the polyester film substrate (B) has a viscosity of less than 100 mPa·s, preferably less than 50 mPa·s, preferably less than 25 mPa·s at 20° C., measured according to ASTM D445.

Where present, the glycidyl esters used in the present invention react with the polyester at elevated temperatures, typically between about 160° C. and 300° C., and do so with rapid reaction times, typically much less than 1 second at 290° C. The reaction is a ring-opening addition of the carboxyl or hydroxyl end-groups of the polyester to the oxirane ring of the glycidyl ester and proceeds with zero elimination of by-products, both during manufacture of the modified polyester and during subsequent manufacture and use of the polyester film substrate (B).

The glycidyl ester component can be introduced at various stages during the film making process, namely:

1. By adding the glycidyl ester during manufacture of the polyester film substrate (B) from its monomers. In this case, the glycidyl ester is preferably added at the end of the polymerisation process, immediately prior to extrusion of the polyester into pellets. In one embodiment, the modified polyester may then be further treated by solid state polymerisation in order to increase the IV to a desired value.
2. By reacting the glycidyl ester with polyester pellets off-line by melting the pellets, mixing the melt with the additive, then re-extruding the modified polyester into pellets.
3. By adding the glycidyl ester (typically as a liquid) to the polyester pellets prior to or during the introduction of the polyester into the extruder used in the film-manufacturing process (for instance by adding the glycidyl ester to the polyester in the hopper of the extruder). The glycidyl ester and the polyester react in the extruder as the mixture is extruded. Preferably a twin-screw extruder is used.
4. By injecting the glycidyl ester (typically as a liquid) into the molten polyester during the extrusion process (i.e. once the polyester is in the molten state within the extruder, typically a twin-screw extruder, and typically after the polyester has passed through any devolatilisation zone) but prior to the polyester being cast into a film.
5. By adding the glycidyl ester during manufacture of the polyester from its monomers, wherein the polyester is extruded directly into a film. The glycidyl ester is preferably added to the polyester melt at the end of the polymerisation process, immediately prior to extrusion of the polyester into a film.

The glycidyl ester is preferably introduced via one of routes (2) to (5) above, preferably via route (4) or (5). In one embodiment, a masterbatch is produced by adding an excess amount of glycidyl ester, relative to the amount desired in the final film, and this is of particular utility for route (2).

Surprisingly improved product performance is observed using process route (4), and in particular films manufactured by this route demonstrate improved hydrolysis stability, relative to films manufactured using masterbatch technology with route (2) above. It is believed that the relatively late addition of glycidyl ester to the polyester in the extrusion process minimises the increase of carboxyl end-groups caused by thermal degradation during film manufacture. In addition, the advantage of route (4) over the masterbatch route, for example, is that it allows greater use of reclaim film (i.e. waste film from the film manufacturing process, for instance, resulting from "edge-trimming" typically performed after the stenter stage in order to provide a film of uniform width). Reclaimed polyester typically has a lower intrinsic viscosity, and a higher concentration of carboxyl end-groups, than virgin polyester chip and the relatively late addition of the glycidyl ester allows the end-groups of both the virgin and reclaim polyester to be modified. The ability to use higher levels of reclaim while providing improved hydrolysis stability is a particular advantage of the present invention.

The direct extrusion process of route (5) is referred to herein as "coupled polymerisation-film production" or "close-coupled polymerisation-film production". This process dispenses with the intermediate step of pelletisation, and is particularly advantageous. A close-coupled process may be operated with a static or dynamic mixing arrangement between polymerisation reactor and film die, wherein the mixing is effected after addition of the glycidyl ester. Static and dynamic mixing systems are conventional in the art. In a static mixing arrangement, the arrangement of non-moving elements continuously blends the materials as the melt-stream flows through the mixer. Suitable dynamic mixing systems include extruders or other Archimedean screw systems. In a preferred embodiment of the present invention, the close-coupled process is operated with a static mixing arrangement, and it has been surprisingly observed that sufficient mixing to achieve the benefits of the invention can be obtained with only a static mixing arrangement. It is surprising that a close-coupled process applied to this system is able to dispense with dynamic mixing without detriment to the final film properties. In the close-coupled process, an intervening solid state polymerisation step may be, and preferably is, avoided. The close-coupled process reduces the amount of water present in the polymer, thereby avoiding the need for a drying step prior to film formation, and also reducing side reactions between water and the glycidyl ester. The reduced water content allows the intervening solid state polymerisation step to be dispensed with, and allows the polyester film to tolerate a higher carboxyl end-group content without loss of hydrolytic stability. Thus, in this embodiment, the carboxyl end-group content is typically in the range of from about $15 \times 10^{-6}$ to about $50 \times 10^{-6}$ milliequivalents/g (meq/g), more typically from about $20 \times 10^{-6}$ to about $40 \times 10^{-6}$ meq/g, whereas a typical SSP process reduces the carboxyl end-group content to less than about $15 \times 10^{-6}$ meq/g, and typically about $10 \times 10^{-6}$ meq/g. Carboxyl content is determined by titration with sodium hydroxide after dissolution of the polymer in hot benzyl alcohol.

Where the polyester film substrate (B) comprises a glycidyl ester hydrolysis stabiliser as described above, preferably, it also further comprises at least one metal cation selected from the group consisting of Group I and Group II metal cations.

In particular, preferably, the reaction of the glycidyl ester with the polyester of the polyester film substrate (B) is carried out in the presence of at least one metal cation selected from the group consisting of Group I and Group II metal cations.

The metal cations are suitably present in an amount sufficient to catalyse the reaction between the hydrolysis stabiliser and at least some of the end-groups of the polyester of the polyester film substrate (B).

In a preferred embodiment, the amount of the metal cation present in the polyester film substrate (B) and/or present in the reaction mixture during the reaction of the hydrolysis stabiliser with the end-groups of the polyester of the polyester film substrate (B), is at least 10 ppm, preferably at least 15 ppm, at least 40 ppm, preferably at least 45 ppm, preferably at least 65 ppm, preferably at least 80 ppm, and preferably at least 100 ppm by weight, relative to the amount of polyester. Preferably, the amount of the metal cation is not more than about 1000 ppm, preferably not more than about 500 ppm, preferably not more than about 275 ppm, typically not more than about 200 ppm, and in one embodiment not more than about 150 ppm by weight, relative to the amount of polyester. Preferably, the amount of the metal cation is in the range from 45 ppm to 500 ppm, more preferably from 65 ppm to 275 ppm, more preferably from 100 ppm to 200 ppm by weight, relative to the amount of polyester.

As used herein, the terms "Group I" and "Group II" have their conventional chemical meaning and refer to the corresponding Groups in the periodic table. In a preferred embodiment, the metal cations are selected from Group I metal cations, preferably selected from sodium and potassium, and most preferably sodium.

The catalytic effect of the Group I or Group II cation is not dependent on the associated anion, and therefore any appropriate counter-ion may be used. In one embodiment, the anion may be selected from hydroxide, polyacrylate, hydrogen carbonate, carboxylate, chloride, acetate, formate and nitrate. In a preferred embodiment, the anion is selected from hydroxide or polyacrylate. Suitable polyacrylates include those having a molecular weight of from about 1,000 to about 10,000.

The metal cation(s) may be added to the polyester or its monomers prior to or simultaneously with, the addition of the glycidyl ester. Alternatively, the metal cation(s) may be added to the glycidyl ester prior to or simultaneously with the addition of said glycidyl ester to the polyester or its monomers. Preferably, the metal cation(s) are added to the polyester or its monomers, and preferably prior to the addition thereto of the glycidyl ester. In a preferred embodiment, the metal cations are added at the start of the polymerisation reaction to prepare the polyester of the polyester film substrate (B).

Alternatively or in addition, the polyester film substrate (B) may comprise a UV stabiliser. Compounds suitable for use as UV-stabilisers have an extinction coefficient much higher than that of the polyester, such that most of the incident UV light is absorbed by the UV-stabiliser rather than by the polyester. The UV-stabiliser generally dissipates the absorbed energy as heat, thereby avoiding degradation of the polymer chain. Typically, the UV-stabiliser is an organic UV-stabiliser, and suitable examples include those disclosed in Encyclopaedia of Chemical Technology, Kirk-Othmer, Third Edition, John Wiley & Sons, Volume 23, Pages 615 to 627. Particular examples of UV-stabilisers include benzophenones, benzotriazoles (U.S. Pat. Nos. 4,684,679, 4,812, 498 and 4,681,905), benzoxazinones (U.S. Pat. Nos. 4,446, 262, 5,251,064 and 5,264,539) and triazines (U.S. Pat. Nos. 3,244,708, 3,843,371, 4,619,956, 5,288,778 and WO 94/05645). The UV-stabiliser may be incorporated into the polyester film substrate (B) according to one of the methods described herein. In one embodiment, the UV-stabiliser may be chemically incorporated in the polyester chain. EP-A-0006686, EP-A-0031202, EP-A-0031203 and EP-A-0076582, for example, describe the incorporation of a benzophenone into the polyester chain. The specific teaching of the aforementioned documents regarding UV-stabilisers is incorporated herein by reference. In a particularly preferred embodiment, improved UV-stability in the present invention is provided by triazines, more preferably hydroxyphenyltriazines, and particularly hydroxyphenyltriazine compounds of formula (II):

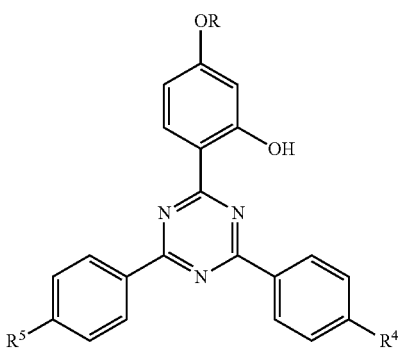

(II)

wherein R is hydrogen, $C_1$-$C_{18}$ alkyl, $C_2$-$C_6$ alkyl substituted by halogen or by $C_1$-$C_{12}$ alkoxy, or is benzyl and $R^4$ and $R^5$ are independently selected from hydrogen, alkyl, alkoxy or phenyl. R is preferably $C_1$-$C_{12}$ alkyl or benzyl, more preferably $C_3$-$C_6$ alkyl, and particularly hexyl. $R^4$ and $R^5$ are preferably hydrogen. An especially preferred UV-stabiliser is 2-(4,6-diphenyl-1,3,5-triazin-2-yl)-5-(hexyl) oxy-phenol, which is commercially available as Tinuvin™ 1577 from BASF, and which is a compound of formula (II) above, wherein R is $C_6H_{13}$ and $R^4$ and $R^5$ are both H. A further especially preferred UV-stabiliser is a 2-(2'-hydroxyphenyl)-4,6-diphenyl triazine which is commercially available as Tinuvin™ 1600 from BASF, and which is a triazine of formula (II) above, wherein R is $CH_2CH(C_2H_5)C_4H_9$, $R^4$ is phenyl and $R^5$ is hydrogen.

The amount of UV-stabiliser incorporated is preferably in the range from 0.1% to 10%, more preferably 0.1% to 5%, more preferably 0.1% to 1.5% by weight, relative to the total weight of the polyester film substrate. The amount of UV-stabiliser depends, inter alia, on the identity of the UV-stabiliser and on the identity of other components present in the layer, such as the identity of any particulate filler present in the layer, as described hereinbelow. Thus, a preferred range for the Tinuvin™ 1600 triazine is from about 0.1 to about 0.75% by weight, and a preferred range for the Tinuvin™ 1577 triazine is from about 0.5 to about 1.2% by weight, relative to the total weight of the layer. For embodiments in which $TiO_2$ (or other photoactive particulate filler) is present in the layer in the preferred amounts described hereinbelow then the amount of UV-stabiliser is preferably in the lower half of the afore-mentioned preferred ranges; and for embodiments in which $BaSO_4$ (or other non-photoactive particulate filler) is present in the layer in the preferred amounts described hereinbelow then the amount of UV-stabiliser is preferably present in an amount which is at least the mid-point of and preferably in the upper half of the afore-mentioned preferred ranges. Where a layer is described herein as containing no or substantially no UV-stabiliser, this means no or substantially no organic UV-stabiliser.

In one embodiment, the polyester film substrate (B) is a monolayer film.

In particular, in a first Embodiment E1, the polyester film substrate (B) comprises a single layer and so the polyester film is comprised of the polyester film substrate (B) and the adhesive coating (A). In this embodiment, the film is disposed in the photovoltaic cell such that adhesive coating (A) is disposed towards the encapsulant resin (i.e. towards the encapsulated photo-active layers) and the polyester film substrate (B) is disposed in the opposed direction and towards the exterior of the PV cell, preferably wherein the polyester film substrate (B) is the outermost layer of the PV cell. In this embodiment, polyester film substrate (B) preferably comprises a hydrolysis stabiliser and a UV-stabiliser and preferably also a particulate filler, as described hereinabove. The adhesive coating (A) may comprise a UV stabiliser and/or a particulate filler, as described hereinabove.

Alternatively, the polyester film substrate (B) may be a multilayer film. Where the polyester film substrate (B) is a multilayer film, it may be a coextruded film which is comprised of two or more coextruded layers. Preferably, the polyester of each coextruded layer is the same, in particular polyethylene terephthalate.

In a second Embodiment E2, wherein the polyester film substrate (B) is a multilayer film, the polyester film comprises said polyester film substrate (B) and said adhesive coating (A), and further comprises a polyester layer (C) which is disposed on polyester film substrate (B) on the opposite side thereof to the adhesive coating (A). In this embodiment, the film is disposed in the photovoltaic cell such that adhesive coating (A) is disposed towards the encapsulant resin (i.e. towards the encapsulated photo-active layers) and the layer (C) is disposed in the opposite direction and towards the exterior of the PV cell. In this embodiment, it is preferred that said polyester film substrate (B) comprises a hydrolysis stabiliser as described hereinabove. In this embodiment, said layer (C) preferably comprises a UV-stabiliser as described hereinabove, and optionally further comprises a hydrolysis stabiliser as described hereinabove. In this embodiment, it is preferred that at least one, and preferably only one, of layer (B) and layer (C) comprise particulate filler as an opacifying agent as described hereinabove for layer (B), i.e. preferably comprising from about 0.3 to about 30% by weight based on the weight of polyester in the layer, and with reference to the preferred particulate filler amounts and identities of layer (B). Where layer (B) of Embodiment E2 comprises particulate filler as described hereinabove, i.e. comprising from about 0.3 to about 30% by weight based on the weight of polyester in the layer, it is preferred that layer (C) is free of particulate filler or contains particulate filler only in minor amounts for the purpose of improving handling, preferably no more than 2.5% by weight, preferably no more than 2% by weight, preferably no more than 1% by weight, more preferably no more than 0.6% by weight, and in one embodiment no more than about 0.3% by weight, based on the weight of the polyester in the layer.

It will appreciated that the amounts and identities of the UV-stabiliser and hydrolysis stabiliser to be used in the respective layers of each of Embodiments E1 and E2 are those provided hereinabove in the detailed description of the UV-stabiliser and hydrolysis stabiliser additives.

The polyester layer (C) in Embodiment E2 may comprise a crystallisable polyester.

Where the polyester layer (C) comprises a crystallisable polyester, the polyester of layer (C) is preferably independently selected from those polyesters described hereinabove for the polyester film substrate (B), wherein the polyester of the layer (C) may be the same as or different to the polyester of polyester film substrate (B), and is preferably selected from polyethylene terephthalate or polyethylene naphthalate, preferably polyethylene terephthalate. The polyester resin of the polyester layer (C) is the major component of the layer, and makes up at least 50% by weight of the total weight of the layer, preferably at least 65%, preferably at least 80%, preferably at least 90%, more typically at least 95% by weight of the total weight of the layer. In this embodiment, the layer (C) is preferably the outermost layer of the PV cell. In this embodiment, said layer (C) preferably comprises a UV-stabiliser as described hereinabove and a hydrolysis stabiliser as described hereinabove. In this embodiment, said layer (C) preferably further comprises particulate filler as an opacifying agent in an amount of from about 0.3 to about 30% by weight based on the weight of polyester in the layer, as described hereinabove for the preferred particulate filler amounts and identities of polyester film substrate (B). In this embodiment, polyester film substrate layer (B) may comprise reclaimed film but otherwise no or substantially no particulate filler is added to layer (B) (wherein "substantially no" in this context means no more than 2.5% by weight, preferably no more than 2% by weight, preferably no more than 1% by weight, more preferably no more than 0.6% by weight, and preferably no more than about 0.3% by weight, based on the weight of the polyester in the layer).

In some embodiments, the polyester film substrate (B) may be comprised of up to about 35 wt % of reclaim (i.e. waste film from the film manufacturing process, for instance, resulting from "edge-trimming" typically performed after the stenter stage in order to provide a film of uniform width). In this case, the polyester film substrate (B) may comprise additives such as hydrolysis stabiliser, UV stabiliser and/or particulate filler as a consequence of the presence of the reclaim.

Formation of the polyester film may be effected by conventional extrusion techniques well-known in the art. In general terms the process comprises the step of extruding polyester compositions through a die, usually at a temperature within the range of from about 280° C. to about 300° C., followed by quenching the extrudate and orienting the quenched extrudate.

Orientation may be effected by any process known in the art for producing an oriented film, for example a tubular or flat film process. The polyester film which forms the polyester film substrate (B) in the present invention may be biaxially oriented. Biaxial orientation is effected by drawing in two mutually perpendicular directions in the plane of the film to achieve a satisfactory combination of mechanical and physical properties. In a tubular process, simultaneous biaxial orientation may be effected by extruding a thermoplastics polyester tube which is subsequently quenched, reheated and then expanded by internal gas pressure to induce transverse orientation, and withdrawn at a rate which will induce longitudinal orientation. In the preferred flat film process, the film-forming polyester is extruded through a slot die and rapidly quenched upon a chilled casting drum to ensure that the polyester is quenched to the amorphous state. Orientation is then effected by stretching the quenched extrudate in at least one direction at a temperature above the glass transition temperature (Tg) of the polyester. Sequential orientation may be effected by stretching a flat, quenched extrudate firstly in one direction, usually the longitudinal direction, i.e. the forward direction through the film stretching machine, and then in the transverse direction. Forward stretching of the extrudate is conveniently effected over a set of rotating rolls or between two pairs of nip rolls, transverse stretching then being effected in a stenter apparatus. Stretching is generally effected so that the dimension of the oriented film is from 2 to 5, more preferably 2.5 to 4.5 times its original dimension in the or each direction of stretching. Typically, stretching is effected at temperatures higher than the Tg of the polyester, preferably about 15° C. higher than the Tg. Greater draw ratios (for example, up to about 8 times) may be used if orientation in only one direction is required. It is not necessary to stretch equally in the machine and transverse directions although this is preferred if balanced properties are desired.

The stretched film may be, and preferably is, dimensionally stabilised by heat-setting under dimensional support at a temperature above the glass transition temperature of the polyester but below the melting temperature thereof, to induce the desired crystallisation of the polyester. The actual heat-setting temperature and time will vary depending on the composition of the film and its desired final thermal shrinkage but should not be selected so as to substantially degrade the toughness properties of the film such as tear resistance. During the heat-setting, a small amount of dimensional relaxation may be performed in the TD by a procedure known as "toe-in". Toe-in can involve dimensional shrinkage of the order 2% to 4% but an analogous dimensional relaxation in the MD is difficult to achieve since low line tensions are required and film control and winding becomes problematic.

The film may be further stabilized through use of an in-line relaxation stage. Alternatively the relaxation treatment can be performed off-line. In this additional step, the film is heated at a temperature lower than that of the heat-setting stage, and with a much reduced MD and TD tension. The tension experienced by the film is a low tension and typically less than 5 kg/m, preferably less than 3.5 kg/m, more preferably in the range of from 1 kg/m to about 2.5 kg/m, and typically in the range of 1.5 kg/m to 2 kg/m of film width. For a relaxation process which controls the film speed, the reduction in film speed (and therefore the strain relaxation) is typically in the range 0% to 2.5%, preferably 0.5% to 2.0%. There is no increase in the transverse dimension of the film during the heat-stabilisation step. The temperature to be used for the heat stabilisation step can vary depending on the desired combination of properties from the final film, with a higher temperature giving better, i.e. lower, residual shrinkage properties. A temperature of 135° C. to 250° C. is generally desirable, preferably 150° C. to 230° C., more preferably 170° C. to 200° C. The duration of heating will depend on the temperature used but is typically in the range of 10 to 40 seconds, with a duration of 20 to 30 seconds being preferred. This heat stabilisation process can be carried out by a variety of methods, including flat and vertical configurations and either "off-line" as a separate process step or "in-line" as a continuation of the film manufacturing process. Film thus processed will exhibit a smaller thermal shrinkage than that produced in the absence of such post heat-setting relaxation.

The polyester film substrate (B) preferably has a thermal shrinkage after being held at a temperature of 150° C. for 30 minutes in the machine direction in the range from about 0.1% to 5%, preferably 0.3% to 1.5%. The polyester film substrate preferably has a thermal shrinkage after being held at a temperature of 150° C. for 30 minutes in the transverse direction in the range from 0% to about 5%, preferably 0.1% to 1.2%. In an alternative preferred embodiment, particularly wherein the polyester film substrate is a heat-stabilised film (as described herein), the thermal shrinkage of the film after being held at a temperature of 150° C. for 30 minutes is in the range from about 0.01% to 1%, preferably from 0.05% to 0.5% and more preferably no more than 0.10% in the machine direction, and preferably no more than 0.10% and more preferably no more than 0.05% in the transverse direction.

The thickness of the polyester film substrate (B) is preferably in the range of from about 5 μm to about 500 μm.

Preferably the thickness is no more than about 250 μm, more preferably no more than about 150 μm, and most preferably no more than about 125 μm. Preferably the thickness is at least about 12 μm, more preferably at least about 15 μm, still more preferably at least about 20 μm, and most preferably at least about 25 μm.

The adhesive coating (A) is derived from a composition which comprises an epoxy resin and a blocked diisocyanate. The composition may be an aqueous composition which comprises the epoxy resin, the blocked diisocyanate and water.

The coating composition preferably has a solids content of at least 1% by weight, preferably at least 2% by weight, preferably at least 3% by weight, preferably at least 5% by weight, preferably at least 10% by weight, preferably at least 20% by weight, preferably at least 30% by weight, preferably at least 40% by weight.

Preferably the composition from which the adhesive coating (A) is derived comprises less than about 50% by weight, preferably less than about 40% by weight, preferably less than about 30% by weight, preferably less than about 20% by weight of the epoxy resin based on the total weight of epoxy resin and blocked diisocyanate in the composition as determined prior to drying the adhesive composition. Advantageously, it has been found that where this is the case, a continuous coating on the polyester substrate can be obtained which, in use, ultimately leads to effective adhesion to the encapsulant resin within a PV cell. Where the composition contains greater than 50% by weight of the epoxy resin then problems with wetting out of the coating on the polyester substrate, which results in a discontinuous coating, may be observed which, in turn, leads to poor adhesion.

In one embodiment, the composition from which the adhesive coating is derived comprises 10% to 50% by weight of epoxy resin and 90% to 50% by weight of blocked diisocyanate, in one embodiment 20% to 50% by weight of epoxy resin and 80% to 50% by weight of blocked diisocyanate, in one embodiment 30 to 40% by weight of epoxy resin and 70 to 60% by weight of blocked diisocyanate based on the total weight of epoxy resin and blocked diisocyanate in the composition as determined prior to drying the adhesive composition. In this regard, it will be appreciated that the composition from which the adhesive coating (A) is derived consists or consists essentially of the epoxy resin, the blocked diisocyanate and water. The composition does not include any further components, in particular resin components, which contribute towards the adhesive effect of the composition. Preferably, the composition from which the adhesive coating (A) is derived does not contain any components having fluorine-containing groups.

It will be appreciated that the epoxy resin and the blocked diisocyanate together preferably make up at least about 85% by weight, preferably at least about 90% by weight, preferably at least about 93% by weight, preferably at least about 95% by weight of the solids content of the composition from which the adhesive coating (A) is derived.

Suitable epoxy resins contain at least two epoxy groups in each molecule and have an epoxide number in the range from 0.10 to 0.80 eq/100 g, preferably in the range from about 0.15 to 0.70 eq/100 g. In one embodiment, the epoxide number of the epoxy resin may be in the range from about 0.45 to about 0.70 eq/100 g. In an alternative embodiment, the epoxide number of the epoxy resin may be in the range from about 0.10 to 0.25 eq/100 g. Such epoxy resins may also have a number average molecular weight as measured by end group analysis using NMR or other spectroscopic method, wet chemistry or Gel Permeation Chromatography (and preferably by Gel Permeation Chromatography) of less than about 4000 and/or a melting temperature of less than about 150° C.

The epoxy resin may be a glycidyl ether of an aliphatic polyol or an epoxy resin which comprises a bisphenol A diglycidyl ether (BADGE) epoxy resin as a component.

Preferably the epoxy resin is a glycidyl ether of an aliphatic polyol. The term "aliphatic polyol" is used herein to refer to organic compounds in which the carbon atoms are linked in either straight or branched open chains and which contain two or more hydroxyl groups. Examples of suitable polyols include glycerol, polyglycols and pentaerythritol. A particularly preferred epoxy resin for use in the adhesive composition is a modified glycerol triglycidyl ether. The term "modified" as used in this context refers to the fact that at least one substituent group of the glycerol triglycidyl ether has been chemically modified. An example of such an epoxy resin is Grilbond® GST which is commercially available from EMS-Griltech. Suitable epoxy resins may be produced using conventional techniques, such as by reacting epichlorohydrin with aliphatic alcohols or polyols to give glycidyl ethers or aliphatic carboxylic acids. This reaction is normally carried out in the presence of an alkali, such as sodium hydroxide, to facilitate the dehydrochlorination of the intermediate chlorohydrin.

An example of a suitable epoxy resin which comprises a BADGE epoxy resin as a component is Beckopox EP 2350w/60WA which is commercially available from Allnex (US).

The adhesive composition further comprises a blocked diisocyanate.

Examples of suitable diisocyanates include those having the general formula $O=C=N-R^6-N=C=O$, wherein $R^6$ represents an aliphatic or aromatic hydrocarbyl group comprising from 2 to 16 carbon atoms. Examples of suitable aromatic diisocyanates include toluene-2,4-diisocyanate, toluene-2,6-diisocyanate, methylenediphenyl-4,4'-diisocyanate, methylenediphenyl-2,4'-diisocyanate and methylenediphenyl-2,2'-diisocyanate. The methylenediphenyldiisocyanates and the toluene-diisocyanates may also be used as mixtures of isomers. Where the diisocyanate is a blocked aromatic diisocyanate, it is preferably a blocked methyldiphenyldiisocyanate (MDI). An example of a suitable blocked MDI is Grilbond® IL-6 60% GST which is commercially available from EMS-Griltech.

Examples of suitable aliphatic diisocyanates include hexamethylenediisocyanate (HDI), dicyclohexylmethane-4,4'-diisocyanate ($H_{12}$MDI; as a single isomer selected from the 4,4'-, 2,4'- and 2,2'-isomers, or as a mixture of isomers) and isophoronediisocyanate (1-isocyanato-3-isocyanatomethyl-3,5,5-trimethyl-cyclohexane; 1PD1). Where the diisocyanate is a blocked aliphatic diisocyanate, it is preferably a blocked HDI. An example of a suitable blocked HDI is Trixene Aqua BI-201® which is commercially available from Baxenden Chemicals Ltd.

The diisocyanate may be in monomeric form or oligomeric form, particularly trimeric form. Trimeric diisocyanates are particularly suitable, particularly for aliphatic diisocyanates, particularly HDI.

A "blocked diisocyanate" is defined herein as a diisocyanate reaction product which is stable at room temperature but which dissociates to regenerate diisocyanate functionality respectively under the influence of heat. In other words, the functionality of the diisocyanate has been reversibly blocked by use of a chemical group, referred to hereinafter as a "blocking group".

Typically temperatures in the range from 120 to 250° C. are necessary to release the blocking groups and free the diisocyanate functionality and the blocking group(s) are selected so that they volatilize from the composition.

Examples of suitable blocking groups include alcohols, caprolactam, phenols, methyl ethyl ketoxime and active methylene compounds. The choice of blocking group will depend on the identity of the diisocyanate. Where the diisocyanate is a blocked MDI, preferably the blocking group is caprolactam. Alternatively, where the diisocyanate is a blocked HDI, preferably the blocking group is 3,5-dimethylpyrazole (DMP). In one embodiment of the present invention, the epoxy resin is a modified triglycidyl ether and the blocked diisocyanate is a caprolactam-blocked MDI-based diisocyanate.

In a further embodiment of the present invention, the epoxy resin is a modified triglycidyl ether and the blocked diisocyanate is a DMP-blocked HDI-based diisocyanate.

The adhesive coating preferably has a dry thickness (i.e. the thickness of the adhesive coating in the finished film) of no more than 5.0 µm, preferably no more than 2.0 µm and more preferably no more than 1.5 µm. In further preferred embodiments, the coating may have a thickness of no more than 1.0 µm, no more than 0.8 µm or no more than 0.5 µm. Preferably, the adhesive coating has a thickness in the range from 0.005 to 0.5 µm, preferably 0.03 to 0.5 µm.

The polyester film of the present invention may be manufactured by a method comprising:
(i) disposing an adhesive coating composition comprising an epoxy resin and a blocked diisocyanate in a liquid vehicle onto a surface of a polyester film substrate;
(ii) drying the adhesive coating composition; and
(iii) heating the dried adhesive coating composition to form a cured adhesive coating.

The adhesive coating composition may be coated onto the polyester film substrate using any suitable coating technique, including gravure roll coating, reverse roll coating, dip coating, bead coating, extrusion-coating, melt-coating or electrostatic spray coating, or by meyer bar coating. Any coating step preferably avoids the use of organic solvent.

The coating composition is preferably applied at a wet-coat thickness to provide a dry thickness of no more than 5.0 µm, preferably no more than 2.0 µm and more preferably no more than 1.5 µm. In further preferred embodiments, the coating composition is applied at a dry thickness of no more than 1.0 µm, no more than 0.8 µm or no more than 0.5 µm. Preferably, the coating composition is applied to provide a dry thickness in the range from 0.005 to 0.5 µm, in one embodiment in the range from 0.03 to 0.5 µm. Within this range, the thickness of the coating is sufficient that excellent adhesion to the polyester substrate is observed and, when used as a back-plane in a PV cell, excellent and robust adhesion to an encapsulant resin is observed, even following prolonged exposure to moisture and/or humidity.

The coating composition is suitably dried in an oven at a temperature of from about 100° C. to about 150° C., preferably from about 120° C. to about 140° C.

The dried coating composition is suitably cured in an oven at a temperature of from about 150° C. to about 250° C., preferably about 190° C. to about 250° C., more preferably about 200° C. to about 230° C., and most preferably about 215° C. to about 230° C.

It will be appreciated that the drying and curing steps may be conducted separately and sequentially, or may be combined into a single heat-treatment comprising the appropriate heating profile.

In one embodiment, drying and curing of the coating composition are performed simultaneously at a temperature of from about 150° C. to about 250° C., preferably about 190° C. to about 250° C., more preferably about 200° C. to about 230° C., and most preferably about 215° C. to about 230° C.

The coating composition may be disposed on a surface of the polyester film in step (a) either "in-line" (i.e. wherein the coating step takes place during film manufacture and before, during or between any stretching operation(s) employed) or "off-line" (i.e. after film manufacture). Preferably, step (a) is conducted in-line.

Where the polyester substrate is biaxially oriented, preferably the adhesive coating composition is coated onto the substrate after it has been stretched in a first direction but before it is stretched in an orthogonal direction i.e. the adhesive coating composition is applied between the first and second stretching steps during the manufacture of the biaxially oriented polyester film. The stretching steps are performed as described above. In a particularly preferred embodiment, a flat, quenched polyester extrudate is stretched initially in the machine direction and the adhesive coating composition is then applied to the uniaxially stretched extrudate. The liquid vehicle (i.e. water in the case of an aqueous adhesive coating composition) is removed from the coating composition as the film enters the stenter oven and the film is then stretched in the transverse direction.

Stretching of the polyester film substrate in the transverse direction is preferably effected at a temperature above the Tg of the of the polyester, preferably about 15° C. higher than the Tg, but not at so high a temperature that rapid curing of the coating occurs before the stretching operation has been completed. In this regard, stretching of the polyester film substrate in the transverse direction is preferably effected at a temperature lower than the temperature at which unblocking of the curing agent takes place.

Preferably, transverse stretching of the polyester film substrate takes place simultaneously with drying of the coating composition, and more preferably at a temperature of from about 100° C. to about 150° C., preferably from about 120° C. to about 140° C.

Heat-setting of the film preferably takes place simultaneously with curing of the coating, and more preferably at a temperature in the range of from 150° C. to 250° C., preferably 190° C. to 250° C., more preferably 200° C. to 230° C., and most preferably 215° C. to 230° C., and for a heating duration typically in the range of from 10 to 40 seconds, and preferably 20 to 30 seconds. Under these conditions, the blocking groups are removed from the blocked diisocyanate to provide free diisocyanate groups which react with the epoxy resin component of the adhesive coating composition.

The exposed surface of the polyester film substrate may, if desired, be subjected to a chemical or physical surface-modifying treatment to improve the bond between the polyester surface and the coating. For example, the exposed surface of the substrate can be exposed to a high voltage electrical stress accompanied by corona discharge. Corona discharge may be effected in air at atmospheric pressure with conventional equipment using a high frequency, high voltage generator, preferably having a power output of from 1 to 20 kW at a potential of 1 to 100 kV. Discharge is conventionally accomplished by passing the film over a dielectric support roller at the discharge station at a linear speed preferably of 1.0 to 500 m per minute. The discharge electrodes may be positioned 0.1 to 10.0 mm from the moving film surface. Typically, however, no such surface-modifying treatment is effected, and the coating composition described above is coated directly onto the surface of the substrate.

The film of the present invention may be used in the manufacture of electronic or opto-electronic devices, such as electroluminescent (EL) display devices (particularly organic light emitting display (OLED) devices), electrophoretic displays (e-paper) and semiconductor devices (such as organic field effect transistors, thin film transistors and integrated circuits generally).

The films of the present invention are particularly suitable for use in PV cells, and particularly as, or as a layer present in, the back-plane of a PV cell. As noted above, a PV cell is a multilayer assembly typically comprising a front-plane, electrode and photovoltaic active layers, and a back-plane and further comprising a front-side encapsulant material and a rear-side encapsulant material. Therefore, according to a further aspect of the present invention, there is provided the use of a composition comprising an epoxy resin and a blocked diisocyanate as an adhesive coating (A) in a polyester film which comprises a polyester film substrate (B) and the adhesive coating, for adhering the polyester film substrate of the film to an encapsulant resin.

A key advantage of the films described herein is that the films (and specifically the adhesive layer (A) of the films) exhibit surprisingly good and improved adhesion to the encapsulant materials used in PV cells, particularly ethylene vinyl acetate (EVA) copolymer resins, typically wherein the vinyl acetate component is in the range from about 28 to about 33 wt %. Suitable EVA encapsulating materials include commercially available Elvax® resins (DuPont, including grades PV1410 to PV1650Z).

Other encapsulant materials include ionomer-based materials, i.e. polymers made up primarily of non-polar repeat units with a minor proportion (typically no more than about 15 wt %) of salt-containing units. Typical ionomers include thermoplastic carboxylate ionomers wherein the non-polar comonomers are selected from ethylene and styrene (preferably ethylene), and containing a minor proportion of salt-containing units such as metal salts (for instance, alkali metal or zinc salts) of methacrylic acid and/or acrylic acid. Exemplary ionomeric encapsulant materials are the copolymers of ethylene and methacrylic acid and/or acrylic acid partially or completely neutralised with alkali metals or zinc, for instance Surlyn® (DuPont; for instance grade 1702). Other encapsulant materials include selected from polyvinylbutyral resins, also commercially available from DuPont (for instance the PV5200 series), and from silicone resins (for instance, Dow Corning's PV-6100 series of optically clear silicone encapsulants). Other encapsulant materials include polyolefins, such as homopolymers and copolymers of ethylene, for instance copolymers with acrylates and/or methacrylates such as methacrylic acid and/or acrylic acid.

The films of the present invention, specifically the adhesive layer (A) of said films, are adhered to the encapsulant resin by a lamination process. Accordingly, the present invention further provides a method for producing a photovoltaic cell comprising a transparent front plane and an encapsulant resin comprising laminating a polyester film comprising polyester film substrate (B) and an adhesive coating (A) directly to the encapsulant resin, wherein the polyester film forms an opaque back plane in the photovoltaic cell and the adhesive is derived from a composition comprising an epoxy resin and a blocked diisocyanate.

The skilled person will be familiar with the conditions under which such a lamination process should be performed. For example, in one embodiment, the lamination process may be carried out at a temperature of about 150° C. and a pressure of 1.2 tonnes, in one embodiment, applied over an A4 area of the film for a period of 20 minutes.

It has surprisingly been found that the particular adhesives selected according to the present invention provide excellent adhesion to encapsulant resins such as EVA. The adhesion strength between an encapsulant material (preferably EVA) and the layer (A) of the film described herein is such that the linear average load is at least 40 N/cm, measured as described herein.

Not only is the adhesion strong immediately after lamination to the EVA resin but it has also been found to remain strong even after exposure to a prolonged period in humid conditions at elevated temperatures. As used herein, the term "prolonged period in humid conditions at elevated temperatures" refers to the environmental conditions which the film experiences during use, for instance as a PV cell, and preferably as measured by an accelerated ageing test using the damp-heat test described herein (85° C. and 85% relative humidity over a period of at least 500 hours, preferably 1000 hours).

In this regard, the films of the present invention preferably exhibit an adhesion strength of the adhesive coating (A) of the film to an encapsulant material (preferably EVA) of at least 40N/cm (measured as the linear average load, as described herein) after accelerated ageing at 85° C. and 85% relative humidity for at least 500 hours.

In particular, the films of the present invention preferably exhibit an adhesion strength of the adhesive coating (A) of the film to an encapsulant material (preferably EVA) of at least 17N/cm, measured as the linear average load, preferably after accelerated ageing at 85° C. and 85% relative humidity for at least 1000 hours.

Furthermore, the films of the present invention preferably exhibit an adhesion strength of the adhesive layer (A) of the film to an encapsulant material of at least 12N/cm, measured as the linear average load, preferably after accelerated ageing at 85° C. and 85% relative humidity for at least 2000 hours.

The adhesion strength between the adhesive coating (A) of the film and the encapsulant material is at least about 25%, preferably at least about 40%, preferably at least 50% of the initial adhesion strength after accelerated ageing at 85° C. and 85% relative humidity for at least 500 hours, and preferably at least 1000 hours, in one embodiment, at least 2000 hours.

Property Measurement

The following analyses were used to characterize the films described herein:

(i) Clarity is evaluated by measuring total luminance transmission (TLT) and haze (% of scattered transmitted visible light) through the total thickness of the film using an M57D spherical hazemeter (Diffusion Systems) according to the standard test method ASTM D1003.

(ii) Transmission Optical Density (TOD) is measured using a Macbeth Densitometer TR 927 (obtained from Dent and Woods Ltd, Basingstoke, UK) in transmission mode.

(iii) Whiteness index is measured using a Colorgard System 2000, Model/45 (manufactured by Pacific Scientific) and the principles of ASTM D 313.

(iv) Intrinsic viscosity (in units of dL/g) of the polyester and polyester film is measured by solution viscometry in accordance with ASTM D5225-98(2003) on a Viscotek™ Y-501C Relative Viscometer (see, for instance, Hitchcock, Hammons & Yau in American Laboratory (August 1994) "The dual-capillary method for modernday viscometry") by using a 0.5% by weight solution of polyester in o-chlorophenol at 25° C. and using the Billmeyer single-point method to calculate intrinsic viscosity:

$$\eta = 0.25\eta_{red} + 0.75(\ln \eta_{rel})/c$$

wherein:
$\eta$=the intrinsic viscosity (in dL/g),
$\eta_{rel}$=the relative viscosity,
c=the concentration (in g/dL), &
$\eta_{red}$=reduced viscosity (in dL/g), which is equivalent to $(\eta_{rel}-1)/c$ (also expressed as $\eta_{sp}/c$ where $\eta_{sp}$ is the specific viscosity).

(v) Hydrolysis resistance may also be assessed by subjecting the film to treatment at 85° C. and 85% relative humidity for up to 1000 hours (the "damp-heat test" (DHT)). The samples were placed in a Binder Constant Climate Chamber (model KBF115 (E2)) set at the aforementioned temperature and humidity for a fixed duration. Properties relating to the aging of the polymer may then be measured at various time intervals. In particular, the adhesion strength to an encapsulant EVA layer may be measured, as described below.

(vi) Adhesion strength of the film to an encapsulant barrier layer (460 μm EVA sheet (Evasa Solarcap® FC100011E)) is assessed using a 180° peel test. The EVA sheet was sandwiched between two samples of the film to be tested (such that the amorphous layer (A) of each film sample was contacted with the EVA layer) and the assembly was laminated together at a heat-seal temperature of 150° C. for 20 minutes in a press providing a pressure of 1.2 tonnes over an A4 area of the sheet. An A4 sheet of the laminate was cut lengthways into strips (2.54 cm in width). The peel test was conducted using a peel speed of 25.4 cm/min, a peel length of 83 mm and a jaw gap of 25 mm. Adhesion strength may be expressed either as the linear peak load or linear average load. The adhesion strength of the film was measured in one or both of the following ways:
(1) As the initial dry adhesion strength;
(2) As the adhesion strength after being subjected to the "damp-heat test" treatment noted above.

The films of the present invention preferably exhibit a linear average adhesion strength of at least 40 N/cm (23 lbf/in) in the dry adhesion strength, and preferably also in the damp-heat test.

(vii) The polyester film is tested for weatherability according to ISO 4892-2.

(viii) Thermal shrinkage is assessed for film samples of dimensions 200 mm×10 mm which were cut in specific directions relative to the machine and transverse directions of the film and marked for visual measurement. The longer dimension of the sample (i.e. the 200 mm dimension) corresponds to the film direction for which shrinkage is being tested, i.e. for the assessment of shrinkage in the machine direction, the 200 mm dimension of the test sample is oriented along the machine direction of the film. After heating the specimen to the predetermined temperature of 150° C. (by placing in a heated oven at that temperature) and holding for an interval of 30 minutes, it was cooled to room temperature and its dimensions re-measured manually. The thermal shrinkage was calculated and expressed as a percentage of the original length.

(ix) Differential scanning calorimeter (DSC) scans are obtained using a Perkin Elmer DSC 7 instrument, Polyester film samples weighing 5 mg were encapsulated into a standard Perkin Elmer aluminium DSC crucible. The film and crucible were pressed flat to ensure that the film was partially constrained in order to minimise effects of relaxation of orientation during heating. The specimen was placed in the sample holder of the instrument and heated at 80° C. per minute from 30 to 300° C. to record the relevant trace. A dry, inert purge gas (nitrogen) was used. The temperature and heat flow axis of the DSC instrument were fully calibrated for the experimental conditions, i.e. for the heating rate and gas flow rate. The values for the peak temperatures, i.e. the endothermic high temperature peak (A) and endothermic low temperature peak (B), were taken as the maximum displacement above a baseline drawn from the onset of each endothermic melting process to the end of each endothermic melting process. Peak temperature measurements were derived using standard analysis procedures within the Perkin Elmer software. Precision and accuracy of the measurements was ±2° C.

(x) The amount of hydrolysis stabiliser in the final film may be measured by $^1$H NMR (D2-1,1,2,2-tetrachloroethane as solvent; GSX-Delta 400 instrument at 80° C.).

The invention is further illustrated by reference to the following examples. The examples are not intended to limit the scope of the invention as described above.

EXAMPLES

In the examples, coated films were prepared, laminated to an EVA encapsulant resin and the strength of the adhesion following prolonged exposure to moisture was assessed. The coatings used in each case are detailed in the specific examples.

Coated films were prepared as follows:

Polyethylene terephthalate was melt extruded, cast onto a cooled rotating drum and stretched in the direction of extrusion to approximately 3 times its original dimensions at a temperature of 150° C. The film was passed into a stenter oven at a temperature of 120° C. where the film and stretched in the transverse direction to approximately 3 times its original dimensions. The biaxially stretched film was heat set at a temperature of about 220° C. The adhesive coating was applied to the surface of the biaxially stretched polyester film by a meyer bar which delivers a specific wet coating thickness onto the film defined by the number of the meyer bar. The final polyester substrate had a film thickness and a dried adhesive coating thickness as set out in the examples below.

The coated film was then laminated to an EVA encapsulant resin at a temperature of 150° C. and a pressure of 1.2 Tonnes over an A4 area for 20 minutes. The adhesion strengths of the films to the encapsulant resin were tested both initially and after prolonged exposure to moisture using the "damp heat test (DHT)", the protocol for which is set out above.

Example 1

Example 1 was carried out in order to assess the effect that the relative proportions of epoxy resin and curing agent present in the adhesive composition used to form the adhesive coating (A) on the polyester film have on the adhesive strength of the bond formed between the adhesive coating and the encapsulant resin.

A number of adhesive compositions comprising the epoxy resin and curing agents components of coating A but in different proportions were prepared as set out in Table 2. All of the coating compositions tested had a solids content of 10% by weight.

In this example, Grilbond® GST was used as the epoxy resin and Grilbond® IL-6 60% GST was used as the blocked diisocyanate. Both of these are commercially available from EMS-Griltech. Grilbond® GST is a modified glycerol triglycidyl ether. Grilbond® IL-6 60% GST is a caprolactam-blocked MDI diisocyanate.

The polyester substrate used was Melinex® 238 (available from Dupont Teijin Films) having a thickness of 250 µm.

The adhesive composition was applied to the polyester substrate in an amount to provide a dry adhesive coating thickness of 600 nm. The curing schedule was a temperature of 220° C. for 30 seconds.

TABLE 1

| Component | Functionality | Formulation (g) | | | | | |
|---|---|---|---|---|---|---|---|
| | | E9.2 | E9.4 | E9.5 | E9.6 | E9.7 | E9.8 |
| Grilbond GST | Epoxy resin | 1.00 | 1.00 | 2.00 | 2.00 | 2.00 | 2.00 |
| Grilbond IL-6 60% GST | Blocked diisocyanate | 4.00 | 1.50 | 2.00 | 1.33 | 0.85 | 0.50 |
| Water | Solvent | 29.00 | 16.50 | 28.00 | 24.65 | 22.25 | 20.50 |
| Mass percentage ratio in wet coating (Epoxy/Blocked isocyanate) | | 20/80 | 40/60 | 50/50 | 60/40 | 70/30 | 80/20 |

After lamination to the encapsulant resin as described above, the dry adhesive strength was measured and the composite structure was subjected to the DHT. The results are illustrated in FIG. 1.

FIG. 1 shows the effect that the ratio of epoxy resin to curing agent present in the adhesive composition from which the adhesive coating (A) of the polyester film is derived has on the adhesive strength and the resistance to damp ageing. It can be seen that where the adhesive composition contains less than about 50 wt % of epoxy resin, good adhesion is observed and this strong adhesion is maintained, even after being subjected to the DHT for 1000 hours.

Figure 2:
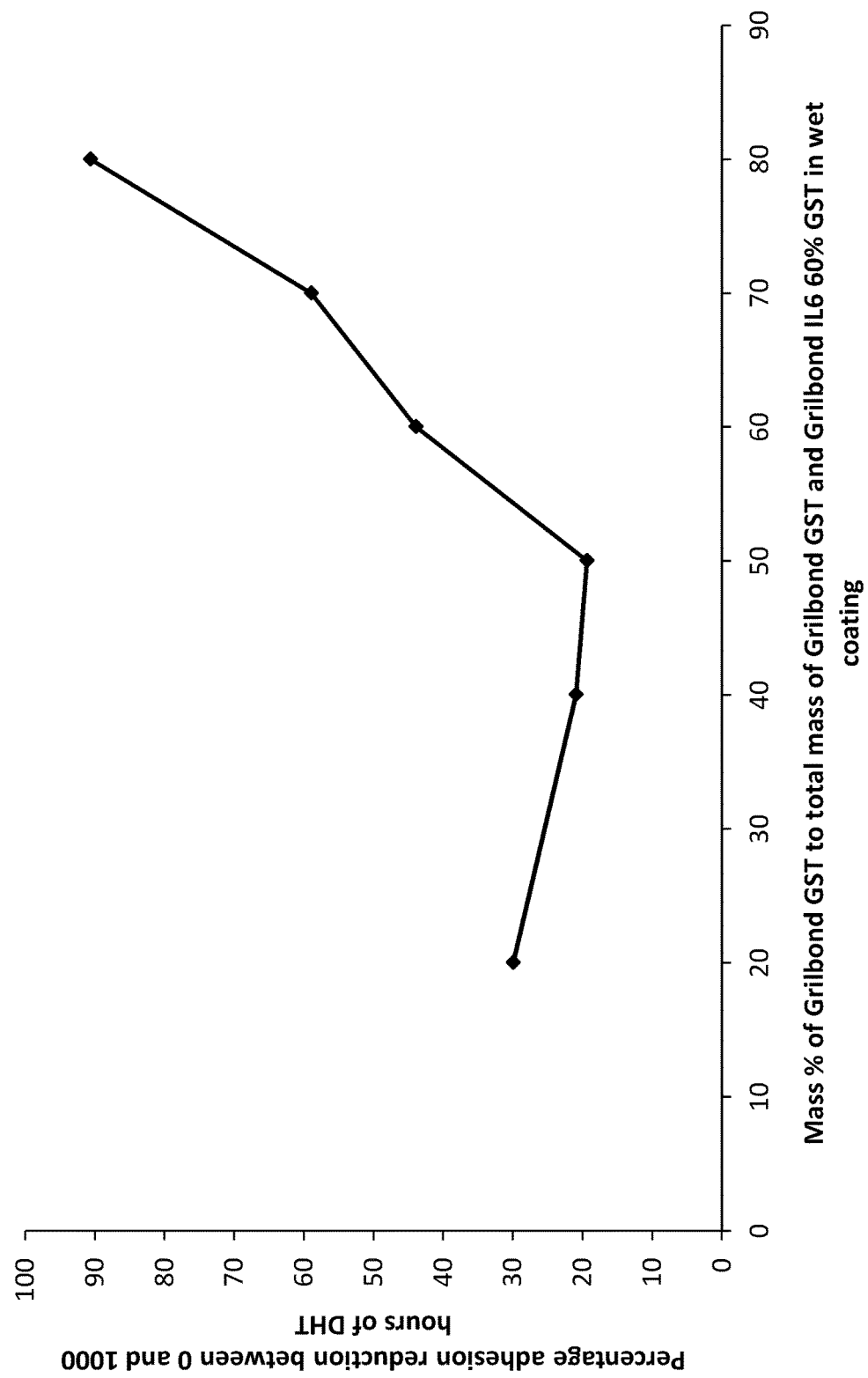
FIG. 2 shows a plot of percentage adhesion reduction over 1000 hours as a function of the mass percentage of epoxy resin in the adhesive compositions plotted in FIG. 1.

The strength of the adhesion during the DHT was monitored and the results are presented in Table 2 and FIG. 2

TABLE 2

| Formulation | % decrease in linear average adhesion after 500 hours damp heat | % decrease in linear average adhesion after 1000 hours damp heat |
|---|---|---|
| E9.2 | 3.5 | 30 |
| E9.4 | 14.4 | 20.9 |
| E9.5 | 6.25 | 19.4 |
| E9.6 | 27.3 | 43.9 |
| E9.7 | 67.3 | 58.9 |
| E9.8 | 77.4 | 90.6 |

These data demonstrate that where the adhesive composition contains less than 50 wt % of epoxy resin, strong adhesion is maintained, even after being subjected to the DHT for 1000 hours.

Example 2

Example 2 was carried out in order to assess the effect that the relative proportions of epoxy resin and curing agent present in the adhesive composition used to form the adhesive coating (A) on the polyester film have on the adhesive strength of the bond formed between the adhesive coating and the encapsulant resin.

For the adhesive compositions tested in Example 2, Grilbond® GST was used as the epoxy resin and Trixene Aqua BI 201® was used as the curing agent. Trixene Aqua BI 201®, which is commercially available from Baxenden Chemicals Ltd., is a DMP-blocked HDI trimer.

A number of adhesive compositions comprising the epoxy resin and curing agents components of coating A but in different proportions were prepared as set out in Table 3. All of the coating compositions tested had a solids content of 10% by weight.

The polyester substrate used was Melinex® 238 (available from Dupont Teijin Films) having a thickness of 250 µm The adhesive composition was applied to the polyester substrate in an amount to provide a dry adhesive coating thickness of 600 nm. The curing schedule was a temperature of 220° C. for 30 seconds.

TABLE 3

| Component | Functionality | Formulation (g) | | | | | | | |
|---|---|---|---|---|---|---|---|---|---|
| | | E10.2 | E10.3 | E10.4 | E10.5 | E10.6 | E10.7 | E10.8 | E10.9 |
| Grilbond GST | Epoxy resin | 1.00 | 1.00 | 1.00 | 2.00 | 2.00 | 2.00 | 2.00 | 2.00 |
| Trixene Aqua BI 201, | Blocked isocyanate | 8.40 | 4.89 | 3.15 | 4.20 | 2.79 | 1.79 | 1.05 | 0.46 |
| Water | Solvent | 34.20 | 23.67 | 18.45 | 30.60 | 26.37 | 23.37 | 21.15 | 19.38 |

After lamination to the encapsulant resin as described above, the dry adhesive strength was measured and the composite structure was subjected to the DHT. The results are illustrated in FIG. 3.

Figure 3:
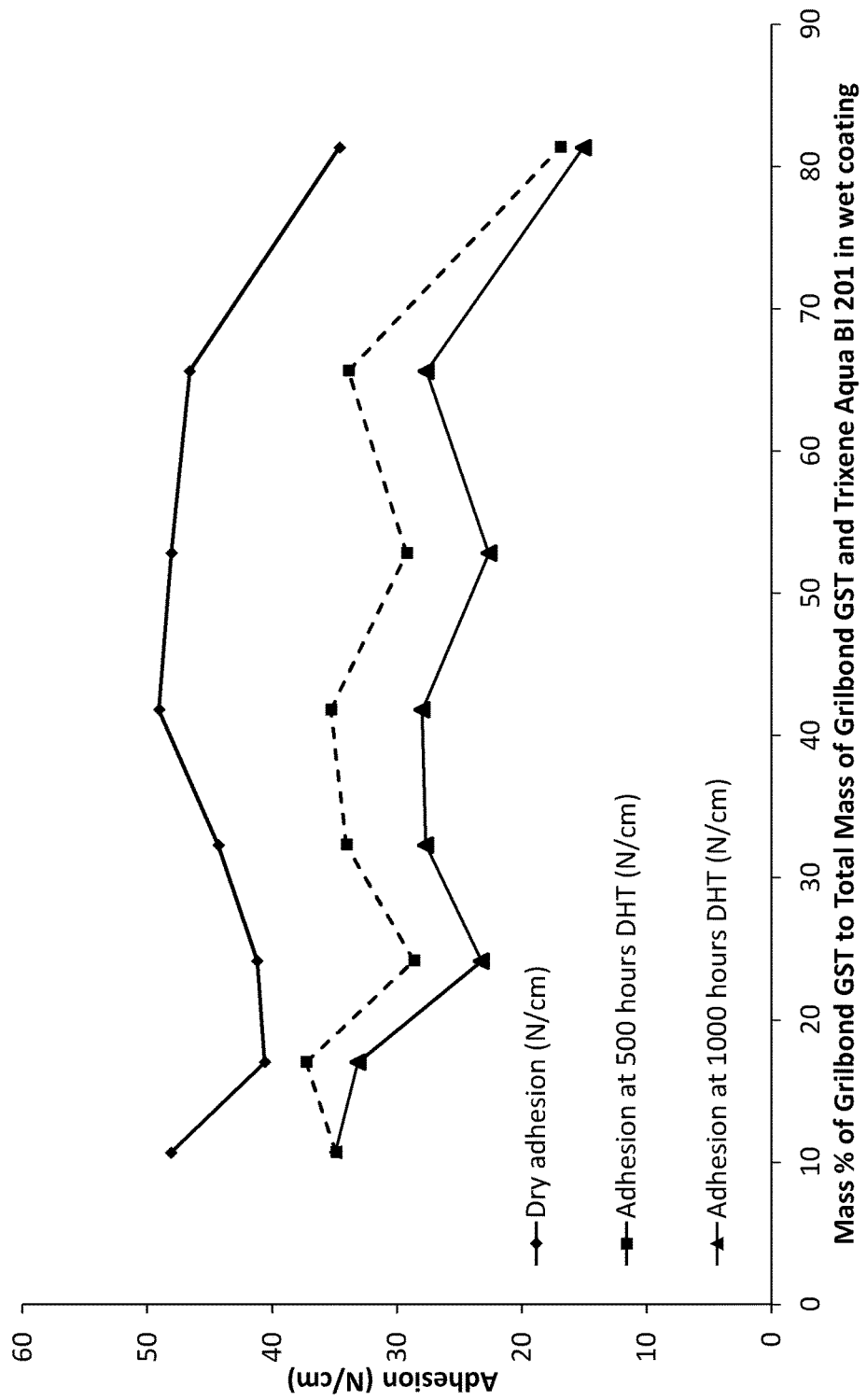
FIG. 3 shows the effect that the ratio of epoxy resin to DMP-blocked HDI trimer curing agent present in the adhesive composition from which the adhesive coating (A) of the polyester film is derived has on the adhesive strength and the resistance to damp ageing.

FIG. 3 shows the effect that the ratio of epoxy resin to curing agent present in the adhesive composition from which the adhesive coating (A) of the polyester film is derived has on the adhesive strength and the resistance to damp ageing. It can be seen that where the adhesive composition contains less than about 50 wt % of epoxy resin, good adhesion is observed (i.e. an adhesion strength of greater than 40 N/cm) and strong adhesion is maintained, even after being subjected to the DHT for 1000 hours.

Figure 4:
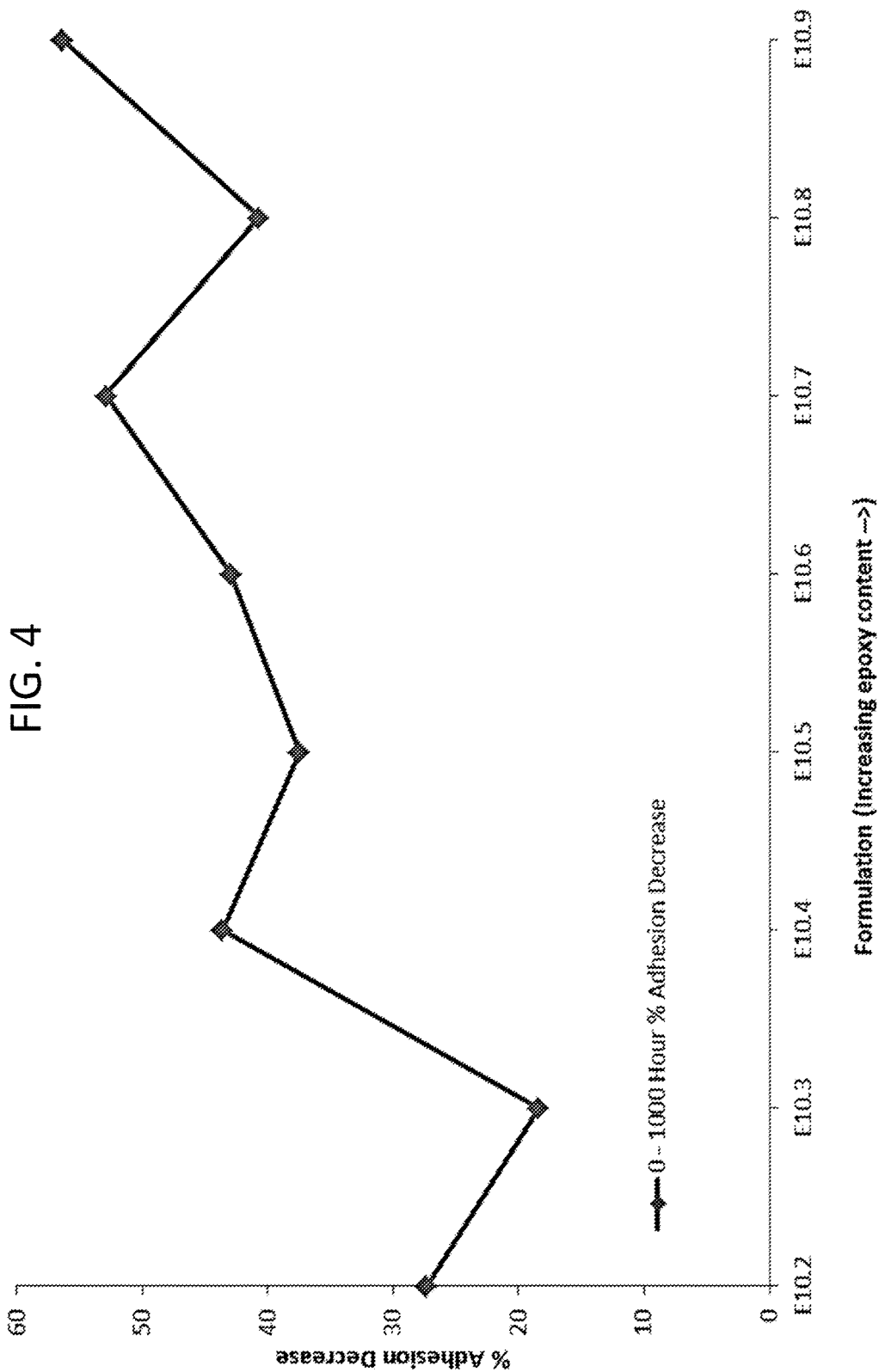
FIG. 4 shows a plot of percentage adhesion reduction over 1000 hours as a function of the adhesive compositions plotted in FIG. 3 ranked in order of Increasing mass percentage of epoxy resin in the compositions.

The strength of the adhesion during the DHT was monitored and the results are presented in Table 4 and FIG. 4

TABLE 4

| Formulation | % decrease in linear average adhesion after 500 hours damp heat | % decrease in linear average adhesion after 1000 hours damp heat |
|---|---|---|
| E10.2 | 27.5 | 27.4 |
| E10.3 | 8.1 | 18.4 |
| E10.4 | 30.4 | 43.6 |
| E10.5 | 23.1 | 37.5 |
| E10.6 | 28.0 | 43 |
| E10.7 | 39.2 | 52.9 |
| E10.8 | 27.2 | 40.7 |
| E10.9 | 51.1 | 56.4 |

These data demonstrate that where the adhesive composition contains less than 50 wt % of epoxy resin, strong adhesion is maintained, even after being subjected to the DHT for 1000 hours.

Example 3

Example 3 was carried out in order to assess the effect of the use of different polyester substrates on the adhesive strength of the bond formed between the adhesive coating and the encapsulant resin.

Two different polyester substrates were tested as set out in Table 5 below. Details of the polyester substrates are as follows:

A: Melinex® 238, thickness 250 μm (available commercially from Dupont Teijin Films)

B: Melinex® 238PV (which contains hydrolysis stabiliser), thickness 125 μm (available commercially from Dupont Teijin Films)

In this example, Grilbond® GST was used as the epoxy resin and Grilbond® IL-6 60% GST was used as the blocked diisocyanate. The ratio of Grilbond® GST to Grilbond® IL-60 60% GST present in the adhesive coating was 30:70 and the adhesive coating had a solids content of 10% by weight.

The adhesive composition was applied to the polyester substrate in each case in an amount to provide a dry adhesive coating thickness of 600 nm. The curing schedule was a temperature of 220° C. for 30 seconds.

TABLE 5

| Substrate PET | DRY adhesion (N/cm) | Adhesion at 500 hours DHT (N/cm) | Adhesion at 1000 hours DHT (N/cm) |
|---|---|---|---|
| A | 63.7 | 61.4 | 44.5 |
| B | 48.1 | 37.5 | 31.0 |

These data show that, while there is a decrease in adhesion where the polyester film substrate (B) contains a hydrolysis stabiliser, the degree of adhesion observed, even after 1000 hours DHT is still high.

Example 4

Example 4 was carried out in order to compare the adhesive strength of the bond formed to the adhesive strengths observed for previously described adhesive coatings.

The adhesive coatings tested are set out in Table 6 below.

TABLE 6

| Coating | Component A | Mass component A before cure (g) | Component B | Mass component B before cure (g) | Component C | Mass component C before cure (g) |
|---|---|---|---|---|---|---|
| 4.1 | Grilbond GST | 1.5 | Grilbond IL-6 60% GST | 3.5 | Water | 115 |
| 4.2 | Grilbond GST | 1.0 | Trixene Aqua BI 201 | 4.9 | Water | 92.5 |
| 4.3 | MichemPrime 4893 RE | 4.3 | Epocros WS700 | 4.3 | Water | 62.4 |
| 4.4 | NeoRez R600 | 9.9 | Epocros WS700 | 13.1 | Water | 195 |
| 4.5 | NeoRez R966 | 3 | Epocros WS700 | 4.0 | Water | 58.9 |

MichemPrime® 4893 RE is an ethylene acrylic acid (EAA) copolymer dispersion available from Michelman.

NeoRez® R600 is an aliphatic urethane dispersion available from DSM Coating Resins, LLC.

NeoRez® R966 is an emulsion of an aliphatic urethane in water which is available from DSM Coating Resins, LLC.

Epocros® WS700 is an oxazoline functionalised polymer which is available from Nippon Shokubai Co., Ltd.

The polyester film substrate used in each case was Melinex® 238PV having a thickness of 125 μm. The dry coating thickness was 180 nm and the cure schedule was 220° C. for 60 seconds.

After EVA lamination, the adhesion results obtained are set out in Table 7 below.

TABLE 7

| Coating | Dry adhesion (N/cm) |
|---------|---------------------|
| 4.1     | 48.1                |
| 4.2     | 13.8                |
| 4.3     | 0                   |
| 4.4     | 0                   |
| 4.5     | 0                   |

The results obtained demonstrate that the initial dry adhesion obtained where the adhesive composition from which the adhesive coating is derived comprises an epoxy resin in combination with a blocked diisocyanate is significantly superior to that obtained with the alternative adhesive compositions which were tested.

The invention claimed is:

1. A photovoltaic cell comprising a transparent front plane, an opaque back plane and an encapsulant resin, wherein the back plane is a polyester film comprising a polyester film substrate (B) and an adhesive coating (A), wherein the adhesive coating is derived from a composition comprising an epoxy resin, a blocked diisocyanate and water, and wherein the encapsulant resin and polyester film are disposed in the photovoltaic cell such that the adhesive coating (A) is in direct contact with the encapsulant resin;
wherein the polyester film substrate (B) is a monolayer film or a multilayer film,
wherein, when the polyester film substrate (B) is a multilayer film, the polyester film comprises said polyester film substrate (B) and said adhesive coating (A), and further comprises a polyester layer (C) which is disposed on polyester film substrate (B) on the opposite side thereof to the adhesive coating (A), and wherein only one of layer (B) and layer (C) comprise a particulate filler; and
wherein the polyester film exhibits an adhesion strength of the adhesive layer (A) of the polyester film to an encapsulant resin of at least 40N/cm, measured as a linear average load, after accelerated aging at 85° C. and 85% relative humidity for at least 500 hours, or wherein the adhesion strength of the adhesive layer (A) of the polyester film to the encapsulant resin is at least 25% of the initial adhesion strength after accelerated aging at 85° C. and 85% relative humidity for at least 500 hours.

2. The photovoltaic cell according to claim 1 wherein the encapsulant resin is an ethylene vinyl acetate copolymer resin (EVA).

3. The photovoltaic cell according to claim 1, wherein the polyester film substrate (B) comprises a polyethylene terephthalate (PET).

4. The photovoltaic cell according to claim 1, wherein the epoxy resin has an epoxide number in the range from 0.10 to 0.80 eq/100 g.

5. The photovoltaic cell according to claim 1, wherein the epoxy resin is a a modified glycerol triglycidyl ether.

6. The photovoltaic cell according to claim 1, wherein the blocked diisocyanate is a blocked hexamethylenediisocyanate (HDI).

7. The photovoltaic cell according to claim 1, wherein the blocked diisocyanate is a blocked methylenediphenyldiisocyanate (MDI).

8. The photovoltaic cell according to claim 1, wherein the blocked diisocyanate is blocked with a group selected from the group consisting of alcohols, caprolactam, phenols, methyl ethyl ketoxime and active methylene compounds.

9. The photovoltaic cell according to claim 1, wherein the epoxy resin is a modified triglycidyl ether and the blocked diisocyanate is a caprolactam-blocked methylenediphenyl-diisocyanate-based diisocyanate.

10. The photovoltaic cell according to claim 1, wherein the epoxy resin is a modified triglycidyl ether and the blocked diisocyanate is a 3,5-dimethylpyrazole-blocked hexamethylenediisocyanate-based diisocyanate.

11. The photovoltaic cell according to claim 1, wherein the adhesive coating is derived from an aqueous composition which comprises 50% by weight or less of the epoxy resin based on the total weight of the epoxy resin and the blocked diisocyanate prior to drying the adhesive composition.

12. The photovoltaic cell according to claim 1, wherein the adhesive coating (A) has a dry thickness of no more than 5 μm.

13. The photovoltaic cell according to claim 1, wherein the polyester film is biaxially oriented.

14. The photovoltaic cell according to claim 1, wherein the polyester film substrate (B) is white.

15. The photovoltaic cell according to claim 1, wherein the adhesive coating is derived from the composition consisting essentially of the epoxy resin, the blocked diisocyanate and water.

16. A method for producing a photovoltaic cell comprising a transparent front plane and an encapsulant resin comprising laminating a polyester film comprising a polyester film substrate (B) and an adhesive coating (A) directly to the encapsulant resin, wherein the polyester film forms an opaque back plane in the photovoltaic cell and the adhesive coating is derived from a composition comprising an epoxy resin, a blocked diisocyanate and water,
wherein the polyester film substrate (B) is a monolayer film or a multilayer film, and wherein, when the polyester film substrate (B) is a multilayer film, the polyester film comprises said polyester film substrate (B) and said adhesive coating (A), and further comprises a polyester layer (C) which is disposed on polyester film substrate (B) on the opposite side thereof to the adhesive coating (A), and wherein only one of layer (B) and layer (C) comprise a particulate filler; and
wherein the polyester film exhibits an adhesion strength of the adhesive layer (A) of the polyester film to the encapsulant resin of at least 40N/cm, measured as the linear average load, after accelerated aging at 85° C. and 85% relative humidity for at least 500 hours, or wherein the adhesion strength of the adhesive layer (A) of the polyester film to the encapsulant resin is at least 25% of the initial adhesion strength after accelerated aging at 85° C. and 85% relative humidity for at least 500 hours.

17. The method according to claim 16, wherein the adhesive coating is derived from the composition consisting essentially of the epoxy resin, the blocked diisocyanate and water.

18. The method according to claim 16, wherein the encapsulant resin is an ethylene vinyl acetate copolymer resin (EVA).

19. The method according to claim 16, wherein the polyester film substrate (B) comprises a polyethylene terephthalate (PET).

20. The method according to claim 16, wherein the epoxy resin has an epoxide number in the range from 0.10 to 0.80 eq/100 g.

21. The method according to claim 16, wherein the epoxy resin is a modified glycerol triglycidyl ether.

22. The method according to claim 16, wherein the blocked diisocyanate is a a blocked hexamethylenediisocyanate (HDI).

23. The method according to claim 16, wherein the curing agent is a blocked methylenediphenyldiisocyanate (MDI).

24. The method according to claim 16, wherein the blocked diisocyanate is blocked with a group selected from the group consisting of alcohols, caprolactam, phenols, methyl ethyl ketoxime and active methylene compounds.

25. The method according to claim 16, wherein the epoxy resin is a modified triglycidyl ether and the blocked diisocyanate is a caprolactam-blocked methylenediphenyldiisocyanate-based diisocyanate.

26. The method according to claim 16, wherein the epoxy resin is a modified triglycidyl ether and the blocked diisocyanate is a 3,5-dimethylpyrazole-blocked hexamethylenediisocyanate-based diisocyanate.

27. The method according to claim 16, wherein the adhesive coating is derived from an aqueous composition which comprises 50% by weight or less of epoxy resin based on the total weight of epoxy resin and blocked diisocyanate prior to drying the adhesive composition.

28. The method according to claim 16, wherein the adhesive coating (A) has a dry thickness of no more than 5 μm.

29. The method according to claim 16, wherein the polyester film is biaxially oriented.

30. The method according to claim 16, wherein the polyester film substrate (B) is white.

\* \* \* \* \*